(12) United States Patent
Matus et al.

(10) Patent No.: US 12,543,503 B2
(45) Date of Patent: Feb. 3, 2026

(54) PIEZOELECTRIC FILMS INCLUDING IONIC LIQUIDS AND METHODS OF MAKING PIEZOELECTRIC FILMS INCLUDING IONIC LIQUIDS

(71) Applicant: E INK CORPORATION, Billerica, MA (US)

(72) Inventors: Yuriy Borisovich Matus, Pleasanton, CA (US); Haiyan Gu, Fremont, CA (US); Ali Sarvi, San Jose, CA (US); Greg Dicinoski, Sydney (AU); Sani Muke, Sydney (AU); Vanessa Lussini, Sydney (AU); Charles Douglas Macpherson, Santa Barbara, CA (US)

(73) Assignee: E Ink Corporation, Billerica, MA (US)

( * ) Notice: Subject to any disclaimer, the term of this patent is extended or adjusted under 35 U.S.C. 154(b) by 401 days.

(21) Appl. No.: 18/172,368

(22) Filed: Feb. 22, 2023

(65) Prior Publication Data
US 2023/0276710 A1    Aug. 31, 2023

Related U.S. Application Data

(60) Provisional application No. 63/314,702, filed on Feb. 28, 2022.

(51) Int. Cl.
*G02F 1/1685* (2019.01)
*C08F 14/22* (2006.01)
(Continued)

(52) U.S. Cl.
CPC ........... *H10N 30/857* (2023.02); *C08F 14/22* (2013.01); *C08J 5/18* (2013.01); *C08K 5/55* (2013.01);
(Continued)

(58) Field of Classification Search
CPC .. H10N 30/857; H10N 30/704; H10N 30/045; C08F 14/22; C08J 5/18;
(Continued)

(56) References Cited

U.S. PATENT DOCUMENTS

| | | |
|---|---|---|
| 4,418,346 A | 11/1983 | Batchelder |
| 5,872,552 A | 2/1999 | Gordon, II et al. |

(Continued)

FOREIGN PATENT DOCUMENTS

| | | |
|---|---|---|
| CN | 101342468 A | 1/2009 |
| CN | 102755841 A | 10/2012 |

(Continued)

OTHER PUBLICATIONS

O'Regan, B. et al., "A Low Cost, High-efficiency Solar Cell Based on Dye-sensitized colloidal TiO2 Films", Nature, vol. 353, pp. 737-740 (Oct. 24, 1991). Oct. 24, 1991.
(Continued)

*Primary Examiner* — Jamara A Franklin
(74) *Attorney, Agent, or Firm* — Brian D. Bean

(57) ABSTRACT

Piezoelectric films including ionic liquids and methods of making piezoelectric films including ionic liquids. The resulting films have higher levels of beta phase and can be poled using external fields without additional treatment, such as stretching. The films are light-transparent. In some embodiments, the piezoelectric material is used to create piezo-electrophoretic films that can be patterned for use as security markers, authentication films, or sensors. The films are generally flexible. Some films are less than 100 μm in thickness. Electrophoretic displays formed from the piezoelectric films do not require an external power source.

26 Claims, 11 Drawing Sheets

(51) Int. Cl.
| | |
|---|---|
| *C08J 5/18* | (2006.01) |
| *C08K 5/55* | (2006.01) |
| *G02F 1/1343* | (2006.01) |
| *G02F 1/167* | (2019.01) |
| *G02F 1/16757* | (2019.01) |
| *G02F 1/1676* | (2019.01) |
| *H10N 30/00* | (2023.01) |
| *H10N 30/857* | (2023.01) |

(52) U.S. Cl.
CPC .......... *G02F 1/13439* (2013.01); *G02F 1/167* (2013.01); *G02F 1/16757* (2019.01); *G02F 1/1676* (2019.01); *H10N 30/704* (2024.05); *C08J 2327/16* (2013.01)

(58) Field of Classification Search
CPC .... C08J 2327/16; C08K 5/55; G02F 1/13439; G02F 1/167; G02F 1/16757; G02F 1/1676; G02F 1/1685; G02F 1/133394; G02F 1/1681; G02F 2202/28
See application file for complete search history.

(56) References Cited

U.S. PATENT DOCUMENTS

| | | | |
|---|---|---|---|
| 5,930,026 A | 7/1999 | Jacobson et al. | |
| 6,130,774 A | 10/2000 | Albert et al. | |
| 6,144,361 A | 11/2000 | Gordon, II et al. | |
| 6,172,798 B1 | 1/2001 | Albert et al. | |
| 6,184,856 B1 | 2/2001 | Gordon, II et al. | |
| 6,225,971 B1 | 5/2001 | Gordon, II et al. | |
| 6,241,921 B1 | 6/2001 | Jacobson et al. | |
| 6,271,823 B1 | 8/2001 | Gordon, II et al. | |
| 6,301,038 B1 | 10/2001 | Fitzmaurice et al. | |
| 6,672,921 B1 | 1/2004 | Liang et al. | |
| 6,788,449 B2 | 9/2004 | Liang et al. | |
| 6,866,760 B2 | 3/2005 | Paolini, Jr. et al. | |
| 6,870,657 B1 | 3/2005 | Fitzmaurice et al. | |
| 6,922,276 B2 | 7/2005 | Zhang et al. | |
| 6,930,818 B1 | 8/2005 | Liang et al. | |
| 6,950,220 B2 | 9/2005 | Abramson et al. | |
| 6,982,178 B2 | 1/2006 | LeCain et al. | |
| 7,002,728 B2 | 2/2006 | Pullen et al. | |
| 7,012,600 B2 | 3/2006 | Zehner et al. | |
| 7,052,571 B2 | 5/2006 | Wang et al. | |
| 7,072,095 B2 | 7/2006 | Liang et al. | |
| 7,075,502 B1 | 7/2006 | Drzaic et al. | |
| 7,116,318 B2 | 10/2006 | Amundson et al. | |
| 7,144,942 B2 | 12/2006 | Zang et al. | |
| 7,158,282 B2 | 1/2007 | Liang et al. | |
| 7,170,670 B2 | 1/2007 | Webber | |
| 7,312,784 B2 | 12/2007 | Baucom et al. | |
| 7,339,715 B2 | 3/2008 | Webber et al. | |
| 7,411,719 B2 | 8/2008 | Paolini, Jr. et al. | |
| 7,420,549 B2 | 9/2008 | Jacobson et al. | |
| 7,453,445 B2 | 11/2008 | Amundson | |
| 7,535,624 B2 | 5/2009 | Amundson et al. | |
| 7,560,004 B2 | 7/2009 | Pereira et al. | |
| 7,561,324 B2 | 7/2009 | Duthaler et al. | |
| 7,572,491 B2 | 8/2009 | Wang et al. | |
| 7,616,374 B2 | 11/2009 | Chen et al. | |
| 7,679,814 B2 | 3/2010 | Paolini, Jr. et al. | |
| 7,715,088 B2 | 5/2010 | Liang et al. | |
| 7,839,564 B2 | 11/2010 | Whitesides et al. | |
| 8,009,348 B2 | 8/2011 | Zehner et al. | |
| 8,319,759 B2 | 11/2012 | Jacobson et al. | |
| 8,361,356 B2 | 1/2013 | Zang et al. | |
| 8,830,561 B2 | 9/2014 | Zang et al. | |
| 9,279,906 B2 | 3/2016 | Kang | |
| 9,520,598 B2 | 12/2016 | Lockett et al. | |
| 9,759,978 B2 | 9/2017 | Liu | |
| 10,087,344 B2 | 10/2018 | Moran | |
| 10,347,904 B2 | 7/2019 | Cho et al. | |
| 10,372,008 B2 | 8/2019 | Telfer et al. | |
| 11,181,799 B2 | 11/2021 | Gu et al. | |
| 2017/0033276 A1* | 2/2017 | Kou | H10N 30/30 |
| 2019/0284423 A1 | 9/2019 | Bodkhe et al. | |
| 2020/0350598 A1 | 11/2020 | Lockett et al. | |

FOREIGN PATENT DOCUMENTS

| | | |
|---|---|---|
| CN | 104492282 A | 4/2015 |
| CN | 106925140 A | 7/2017 |
| CN | 107090088 A | 8/2017 |
| EP | 3327067 A1 | 5/2018 |
| WO | 2007145668 A2 | 12/2007 |
| WO | 2022232485 A1 | 11/2022 |

OTHER PUBLICATIONS

Wood, D., "An Electrochromic Renaissance?" Information Display, 18(3), 24 (Mar. 2002) Mar. 1, 2002.

Bach, Udo. et al., "Nanomaterials-Based Electrochromics for Paper-Quality Displays", Adv. Mater, vol. 14, No. 11, pp. 845-848, (Jun. 5, 2002). Jun. 5, 2002.

Hayes, R.A. et al., "Video-Speed Electronic Paper Based on Electrowetting", Nature, vol. 425, No. 25, pp. 383-385 (Sep. 2003). Sep. 25, 2003.

Shamsuri, Ahmad Adlie et al., "A Succinct Review on the PVDF/ Imidazolium-Based Ionic Liquid Blends and Composites: Preparations, Properties, and Applications", Processes, vol. 9, p. 761 (2021). Apr. 27, 2021.

Ruan, L. et al., "Properties and Applications of the β Phase Poly(vinylidene fluoride)", Polymers 2018, 10(3), 228 Feb. 26, 2018.

Liao L. et al., Direct Writing of PVDF Piezoelectric film based on near electric field added by [Emim] BF 4 Jan. 27, 2020.

Dias J C et al, "Electromechanical actuators based on poly(vinylidene fluoride) with [N1 1 1 2(OH)][NTf2] and [C2mim][C2SO4]", Journal of Material Science, vol. 51, Jul. 18, 2016 (Jul. 18, 2016), pp. 9490-9503, Jul. 18, 2016.

European Patent Office, "International Search Report and Written Opinion", PCT/US2023/062972, Jun. 26, 2023. Jun. 26, 2023.

* cited by examiner

Poling into A direction
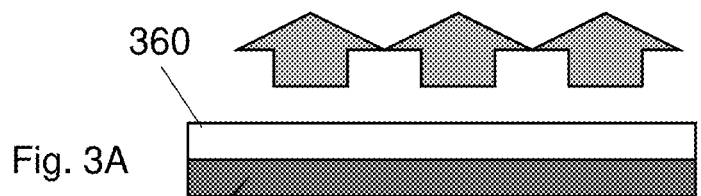
Fig. 3A — Side View
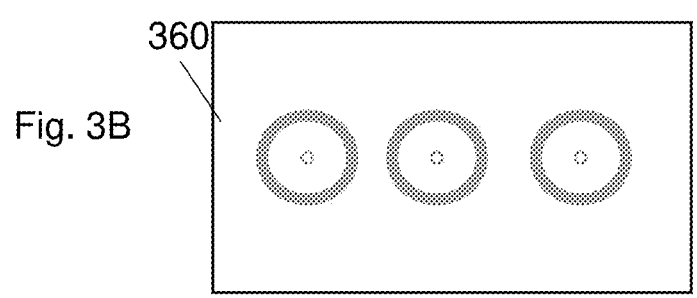
Fig. 3B — Top View
Poling into G direction
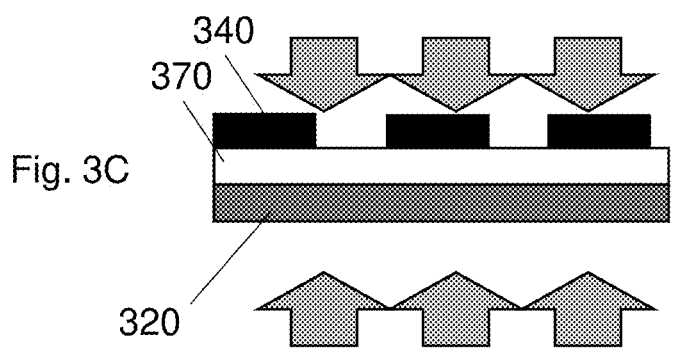
Fig. 3C — Side View
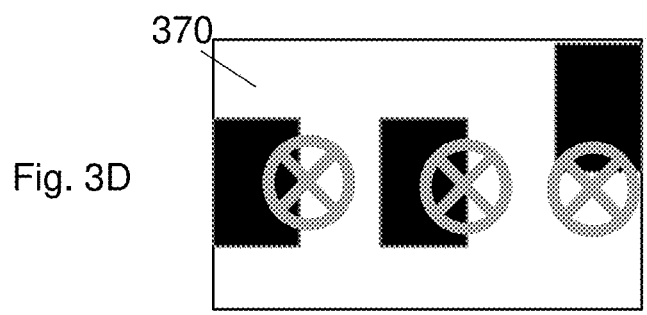
Fig. 3D — Top View

PIEZOELECTRIC FILMS INCLUDING IONIC LIQUIDS AND METHODS OF MAKING PIEZOELECTRIC FILMS INCLUDING IONIC LIQUIDS

REFERENCE TO RELATED APPLICATIONS

This application claims priority to U.S. Provisional Application No. 63/314,702, filed Feb. 28, 2022. All patents and publications disclosed herein are incorporated by reference in their entireties.

BACKGROUND

An electrophoretic display (EPD) is a non-emissive device based on the electrophoresis of charged pigment particles dispersed in a solvent or solvent mixture. The display typically comprises two electrodes placed opposing each other which provide an electric field to drive the motion of the charged pigment particles. One of the electrodes is usually transparent. When a voltage difference is imposed between the two electrodes, the pigment particle(s) migrate to one side or the other causing either the color of the pigment particles or the color of the solvent (if colored) being seen from the viewing side. The electrophoretic fluid typically includes a non-polar solvent and one or more sets of charged particles. The particles may have different optical properties (colors), different charges (positive or negative), different charge magnitudes (zeta potentials), and/or different absorptive properties (broadly light-absorbing, broadly light-reflecting, or selectively-absorbing or selectively reflecting). In the instance where there are multiple particle sets with opposite charge polarities, application of an electric field may cause a particle of one set to appear at the viewing surface while the other particle is driven away from the viewing surface.

Many electrophoretic displays are bi-stable: their optical state persists even after the activating electric field is removed. Bistability is mostly due to induced dipole charge layers forming around the charged pigments due to complex interactions between the pigments, charge control agents, and free polymers dispersed in the solvent. A bistable display can last for years in the last-addressed optical state before being switched again with the application of a new driving field.

Driving an electrophoretic display requires a power source to provide the electric field between the electrodes. The power source is typically a battery, which provides power to the electrodes via driving circuitry. One or more electrodes may be incorporated into an active matrix backplane. The power supply could also be, e.g., a photovoltaic cell, a fuel cell, or a power supply that operates from wall current.

The power supply could also be a piezoelectric element which creates charge through physical motion or thermal expansion, as described in U.S. Pat. No. 5,930,026, which is incorporated by reference in its entirety. Because the electrophoretic display is typically constructed as a film, it is preferable to couple the electrophoretic film to a piezoelectric film. The resulting display is thinner and more flexible. However, only piezoelectric polymer can be made into films that can be coupled to an electrophoretic film. In general, crystalline piezoelectric materials are very brittle and not suitable for incorporation into electrophoretic displays.

Such piezoelectric polymer films, including polyvinylidene fluoride (PVDF), polyvinylidene chloride (PVDC), polyamides, and Parylene-C, require high relative concentrations of polarizable regions to be useful. For example, in PVDF, the fluorine atoms in the polymer chains must be locally aligned to achieve a suitable piezoelectric effect. However, because it is a polymer, when melted the PVDF chains typically assume a lowest energy state, known as the alpha phase, in which the fluorine atoms are anti-aligned and can be as far apart from each other as possible. The alpha phase of PVDF has very little piezoelectric response. Other phases, such as beta and gamma, have fluorine atoms predominantly in the same direction, and have much greater piezoelectric response. To achieve sufficient beta phase concentrations, it is often necessary to stretch piezoelectric polymer films, such as PVDF, after formation from melt to induce domains of stress which increases the polarizability. The stretched polymer films can then be poled to align the beta phases in order to increase the piezoelectric response, i.e., the strength of the local electric field.

However, stretching polymer films after formation results in inhomogeneities in the film thickness. Stretching can also "craze" the film, causing it to distort passing light. It is possible avoid stretching the piezoelectric polymer films by adding charged inorganic particles that increase the local polarizability, such as clays and carbon black. However, in the concentration regimes where the charged additive particles are effective, the composite piezoelectric polymer films typically lose their transparency due to a combination of scattering and absorption by the additive particles. Accordingly, it is very difficult to produce thin, transparent piezoelectric films with uniform thickness and sufficient beta (or gamma) phase to be useful for piezoelectric applications.

SUMMARY

Disclosed herein are piezoelectric films formed from a mixture of polyvinylidene fluoride (PVDF) and ionic liquids, as well as methods of making such piezoelectric films. Because of the presence of the ionic liquids, the resulting piezoelectric films have higher concentrations of beta phase than the PVDF, alone, and the films do not need to pulled to increase the proportion of beta phase. Accordingly, the piezoelectric films can be made thin and transparent and suitable for poling, e.g., with electric fields, as discussed below. Because the piezoelectric films are not pulled, they do not suffer from optical stretch distortions, tears, and variations in thickness across the film. Such variations in thickness will result in different optical responses in a low voltage electrophoretic film when such films are coupled to the piezoelectric films. Accordingly, the piezoelectric films described herein allow for the creation of security markers, authentication labels, indicators, and strain sensors, that work well with electrophoretic films. Such films do not require any external electric power. They can be switched between optical states with simple mechanical motion (see, e.g., FIGS. 1A and 1). Nonetheless, it is feasible to use the piezoelectric films described herein with powered electrophoretic displays.

In a first aspect, the invention includes a piezoelectric film comprising polyvinylidene fluoride (PVDF) and less than 10% (wt/wt) of an ionic liquid. In some embodiments, the piezoelectric film is less than 10 μm thick. In some embodiments, the ionic liquid comprises alkyl-substituted imidazolium cations, alkyl-substituted pyridinium cations, N-heterocyclic cations derived from pyridine, fluorinated counter anions, sulfated counter anions, dicyanamides (N(CN)2), quaternary ammonium cations, or combinations thereof. In some embodiments, the alkyl-substituted imidazolium cation is 1-Butyl-3-methylimidazolium (BMIM), 1-Ethyl-3- methylimidazolium (EMIM), 1-butyl-2,3-dimethylimidazolium (DBMIM), 1-octyl-3-methylimidazolium (OMIM), 1,3-di(N,N-dimethylaminoethyl)-2-methylimidazolium (DAMI), 1-decyl-3-methylimidazolium (DMIM), 1-dodecyl-3-methyl-dodecylimidazolium), and 1-butyl-2,3-dimethylimidazolium (BMMIM). In some embodiments, the N-heterocyclic cation derived from pyridine is 4-methyl-N-butyl-pyridinium (MBPy) or N-octylpyridinium (C8Py). In some embodiments, the fluorinated counter anion is tetrafluoroborate (BF4), hexafluorophosphate (PF6), bis-trifluoromethanesulfonimide (NTf2), or trifluoromethanesulfonate (OTf). In some embodiments, the quaternary ammonium cation is tetraethylammonium (TEA) or tetrabutylammonium (TBA). In some embodiments, the sulfated counter anion is hydrogen sulfate (HSO4), methyl sulfate (MeOSO3), trifluoromethyl sulfate (CF3OSO3), ethyl sulfate (EtOSO3), or perfluoroethyl sulfate (CF3CF2OSO3). In some embodiments, the ionic liquid is 1-Ethyl-3-methylimidazolium tetrafluoroborate (EMIM) (BF4). In some embodiments, the film is light-transmissive. In some embodiments, the piezoelectric film further comprising a copolymer selected from trifluoroethylene (TrFE), hexafluoropropylene (HFP), and chlorotrifluoroethylene (CTFE).

In some embodiments, an electrophoretic display film can be created, less than 100 μm thick (top to bottom), comprising a first adhesive layer, an electrophoretic medium layer, a patterned PVDF film comprising zones of differential polarization, and a flexible, light-transmissive electrode layer. The PVDF film can be any of the types described above. In some embodiments, the electrophoretic medium layer comprises a plurality of microcapsules containing a non-polar fluid and charged pigment particles that move toward or away from the piezo electric layer when the piezo electric layer is flexed, wherein the microcapsules are coupled to each other with a polymer binder. In some embodiments, the electrophoretic medium layer comprises a plurality of microcells containing a non-polar fluid and charged pigment particles that move toward or away from the piezo electric layer when the piezo electric layer is flexed, wherein the non-polar fluid and charged pigment particles are sealed in the microcells with a sealing layer. In some embodiments, the film is less than 50 μm thick. In some embodiments, the patterned piezo electric layer comprises polyvinylidene fluoride (PVDF). In some embodiments, the PVDF is poled to create the zones of differential polarization. In some embodiments, the flexible, light-transmissive electrode layer comprises a metal oxide comprising tin or zinc. In some embodiments, the flexible, light-transmissive electrode layer comprises poly(3,4-ethylenedioxythiophene) (PEDOT). In some embodiments, the invention includes an electrophoretic display film assembly comprising a release sheet coupled to an electrophoretic display film as described above, wherein the release sheet is coupled to the first adhesive layer. In some embodiments, a second adhesive layer coupled to the flexible, light-transmissive electrode layer, and a second release sheet coupled to the second adhesive layer. In some embodiments, an electrophoretic display film can be created, less than 100 μm thick (top to bottom), comprising, a first adhesive layer, a patterned PVDF film comprising zones of differential polarization, an electrophoretic medium layer; and a flexible, light-transmissive electrode layer. The patterned PVDF film can be made according to any of the PVDF films described above. In some embodiments, an electrophoretic display film can be created, less than 100 μm thick (top to bottom), comprising, an adhesive layer, an electrophoretic medium layer, a patterned PVDF film comprising zones of differential polarization, and a conductive adhesive layer. The patterned PVDF film can be made according to any of the PVDF films described above.

In a second aspect, the invention includes a method of making a piezoelectric film comprising polyvinylidene fluoride (PVDF). The method includes providing a powdered or pelletized polymer comprising PVDF, combining less than 10% (wt ionic liquid/wt PVDF) of an ionic liquid with the PVDF to create a mixture, diluting the mixture with an aprotic solvent to create a slurry, casting the slurry on a release substrate to create a slurry film, heating the slurry film to create a piezoelectric film comprising PVDF, and removing the piezoelectric film comprising PVDF from the release substrate. In some embodiments, the aprotic solvent comprises dimethylformamide (DMF), dimethylacetamide, or 1-methy-2-pyrrolidone. In some embodiments, the powdered or pelletized polymer comprising PVDF further includes a copolymer selected from trifluoroethylene (TrFE), hexafluoropropylene (HFP), and chlorotrifluoroethylene (CTFE). In some embodiments, the piezoelectric film is less than 10 μm thick. In some embodiments, the ionic liquid comprises alkyl-substituted imidazolium cations, alkyl-substituted pyridinium cations, N-heterocyclic cations derived from pyridine, fluorinated counter anions, sulfated counter anions, dicyanamides (N(CN)2), quaternary ammonium cations, and combination thereof. In some embodiments, the alkyl-substituted imidazolium cation is 1-Butyl-3-methylimidazolium (BMIM), 1-Ethyl-3-methylimidazolium (EMIM), 1-butyl-2,3-dimethylimidazolium (DBMIM), 1-octyl-3-methylimidazolium (OMIM), 1,3-di(N,N-dimethylaminoethyl)-2-methylimidazolium (DAMI), 1-decyl-3-methylimidazolium (DMIM), 1-dodecyl-3-methyl-dodecylimidazolium), and 1-butyl-2,3-dimethylimidazolium (BMMIM). In some embodiments, the N-heterocyclic cation derived from pyridine is 4-methyl-N-butyl-pyridinium (MBPy) or N-octylpyridinium (C8Py). In some embodiments, the fluorinated counter anion is tetrafluoroborate (BF4), hexafluorophosphate (PF6), bis-trifluoromethanesulfonimide (NTf2), or trifluoromethanesulfonate (OTf). In some embodiments, the quaternary ammonium cation is tetraethylammonium (TEA) or tetrabutylammonium (TBA). In some embodiments, the sulfated counter anion is hydrogen sulfate (HSO4), methyl sulfate (MeOSO3), trifluoromethyl sulfate (CF3OSO3), ethyl sulfate (EtOSO3), or perfluoroethyl sulfate (CF3CF2OSO3). In some embodiments, the ionic liquid is 1-Ethyl-3-methylimidazolium tetrafluoroborate (EMIM) (BF4). In some embodiments, the film is light-transmissive. In some embodiments, less than 1% (wt ionic liquid/wt PVDF) of ionic liquid is combined with PVDF to create a mixture.

In some embodiments, an electrophoretic display film can be constructed with a PVDF film made with the methods described above. An electrophoretic display film can be made by coupling a film of polyvinylidene fluoride (PVDF) to a polymer film comprising acrylates, vinyl ethers, or epoxides to create a piezo-microcell precursor film, coupling the piezo-microcell precursor film to a flexible, light-transmissive electrode layer, coupling the light-transmissive electrode layer to a first release film with a first adhesive layer, embossing the piezo-microcell precursor film to create an array of microcells, wherein the microcells have a bottom, walls, and a top opening, filling the microcells with an electrophoretic medium through the top opening, and sealing off the top opening of the filled microcells with a water-soluble polymer. In some embodiments, the method further comprises applying a primer to the polymer film comprising acrylates, vinyl ethers, or epoxides before coupling the polymer film to the film of polyvinylidene fluoride (PVDF). In some embodiments, the method further comprises coupling the water-soluble polymer to a second release film with a second adhesive layer. In some embodiments, the method further comprises removing the first release film to produce an electrophoretic display film that is less than 100 µm thick. In some embodiments, the electrophoretic medium layer comprises a plurality of microcells containing a non-polar fluid and charged pigment particles that move toward or away from the piezo electric layer when the piezo electric layer is flexed, wherein the non-polar fluid and charged pigment particles are sealed in the microcells with a sealing layer. In some embodiments, the PVDF is poled to create differential zones of polarization. In some embodiments, the flexible, light-transmissive electrode layer comprises a metal oxide comprising tin or zinc. In some embodiments, the flexible, light-transmissive electrode layer comprises poly(3,4-ethylenedioxythiophene) (PEDOT). In some embodiments, the film of polyvinylidene fluoride is patterned with an electric field to create areas of differing polarization. In some embodiments, the method further comprises patterning the completed electrophoretic display film with an electric field to create areas of differing polarization in the film of polyvinylidene fluoride.

BRIEF DESCRIPTION OF DRAWINGS

FIG. 3A illustrates a side view of a piezo-electric film poled in the A direction.

FIG. 3B illustrates a top view of a piezo-electric film poled in the A direction.

FIG. 3C illustrates a side view of a piezo-electric film poled in the G direction using a conductive mask.

FIG. 3D illustrates a top view of a piezo-electric film poled in the G direction using a conductive mask.

DETAILED DESCRIPTION

Figure 1A:
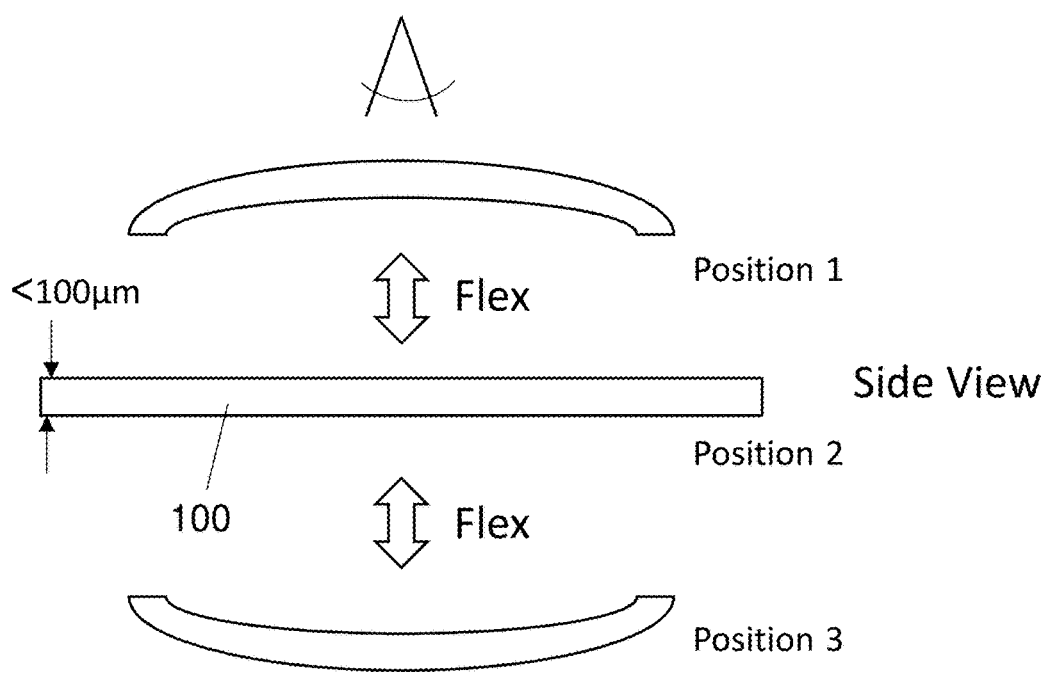
FIG. 1A shows a side view of a piezo-electrophoretic display film of the invention, which includes a star-shaped area of differential polarization. Three exemplary positions, convex, neutral, and concave, are shown from the side. The total thickness of the piezo-electrophoretic display film can be less than 100 µm, e.g., less than 50 µm, e.g., less than 25 µm.

Piezoelectric films including ionic liquids and methods of making piezoelectric films including ionic liquids are disclosed herein. The resulting films have higher levels of beta phase and can be poled using external fields without additional treatment, such as stretching. The films are light-transparent. The films are generally flexible. Some films are less than 100 µm in thickness. In some embodiments, the piezoelectric films can be combined with an electrophoretic medium to create a piezo-electrophoretic film, and the resulting piezo-electrophoretic film can be patterned with high-voltage electric fields after fabrication. This feature allows a final user of the piezo-electrophoretic film to address the piezoelectric materials with, e.g., a corona discharge at the point of production, which may include, e.g., a bar code or a serial number that is only viewable when the piezo-electrophoretic film is manipulated. Such films are useful as security markers, authentication films, indicators, or sensors. The films are generally flexible. Some films are less than 100 μm in thickness. In some embodiments, the piezo-electrophoretic films are less than 50 μm and foldable without breaking. Displays formed with the films do not require an external power source.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in U.S. Pat. No. 7,170,670 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

The term "gray state" is used herein in its conventional meaning in the imaging art to refer to a state intermediate two extreme optical states of a pixel, and does not necessarily imply a black-white transition between these two extreme states. For example, several of the E Ink patents and published applications referred to below describe electrophoretic displays in which the extreme states are white and deep blue, so that an intermediate "gray state" would actually be pale blue. Indeed, as already mentioned, the change in optical state may not be a color change at all. The terms "black" and "white" may be used hereinafter to refer to the two extreme optical states of a display, and should be understood as normally including extreme optical states which are not strictly black and white, for example, the aforementioned white and dark blue states. The term "monochrome" may be used hereinafter to denote a display or drive scheme which only drives pixels to their two extreme optical states with no intervening gray states.

The term "pixel" is used herein in its conventional meaning in the display art to mean the smallest unit of a display capable of generating all the colors which the display itself can show. In a full color display, typically each pixel is composed of a plurality of sub-pixels each of which can display less than all the colors which the display itself can show. For example, in most conventional full color displays, each pixel is composed of a red sub-pixel, a green sub-pixel, a blue sub-pixel, and optionally a white sub-pixel, with each of the sub-pixels being capable of displaying a range of colors from black to the brightest version of its specified color.

Several types of electro-optic displays are known. One type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. Nos. 6,301,038; 6,870,657; and 6,950,220. This type of medium is also typically bistable.

Another type of electro-optic display is an electro-wetting display developed by Philips and described in Hayes, R. A., et al., "Video-Speed Electronic Paper Based on Electrowetting", Nature, 425, 383-385 (2003). It is shown in U.S. Pat. No. 7,420,549 that such electro-wetting displays can be made bistable.

One type of electro-optic display, which has been the subject of intense research and development for a number of years, is the particle-based electrophoretic display, in which a plurality of charged particles move through a fluid under the influence of an electric field. Electrophoretic displays can have attributes of good brightness and contrast, wide viewing angles, state bistability, and low power consumption when compared with liquid crystal displays.

An electrophoretic display normally comprises a layer of electrophoretic material and at least two other layers disposed on opposed sides of the electrophoretic material, one of these two layers being an electrode layer. In most such displays both the layers are electrode layers, and one or both of the electrode layers are patterned to define the pixels of the display. For example, one electrode layer may be patterned into elongate row electrodes and the other into elongate column electrodes running at right angles to the row electrodes, the pixels being defined by the intersections of the row and column electrodes. Alternatively, and more commonly, one electrode layer has the form of a single continuous electrode and the other electrode layer is patterned into a matrix of pixel electrodes, each of which defines one pixel of the display. In another type of electrophoretic display, which is intended for use with a stylus, print head or similar movable electrode separate from the display, only one of the layers adjacent the electrophoretic layer comprises an electrode, the layer on the opposed side of the electrophoretic layer typically being a protective layer intended to prevent the movable electrode damaging the electrophoretic layer.

Numerous patents and applications assigned to or in the names of the Massachusetts Institute of Technology (MIT) and E Ink Corporation describe various technologies used in encapsulated electrophoretic and other electro-optic media. Such encapsulated media comprise numerous small capsules, each of which itself comprises an internal phase containing electrophoretically-mobile particles in a fluid medium, and a capsule wall surrounding the internal phase. Typically, the capsules are themselves held within a polymeric binder to form a coherent layer positioned between two electrodes. The technologies described in these patents and applications include:

(a) Electrophoretic particles, fluids and fluid additives; see for example U.S. Pat. Nos. 7,002,728 and 7,679,814;

(b) Capsules, binders and encapsulation processes; see for example U.S. Pat. Nos. 6,922,276 and 7,411,719;

(c) Films and sub-assemblies containing electro-optic materials; see for example U.S. Pat. Nos. 6,982,178 and 7,839,564;

(d) Backplanes, adhesive layers and other auxiliary layers and methods used in displays; see for example U.S. Pat. Nos. 7,116,318 and 7,535,624;

(e) Color formation and color adjustment; see for example U.S. Pat. Nos. 7,075,502 and 7,839,564;

(f) Methods for driving displays; see for example U.S. Pat. Nos. 7,012,600 and 7,453,445;

(g) Applications of displays; see for example U.S. Pat. Nos. 7,312,784 and 8,009,348;

(h) Non-electrophoretic displays, as described in U.S. Pat. Nos. 6,241,921; 6,950,220; 7,420,549 and 8,319,759; and U.S. Patent Application Publication No. 2012/0293858;

(i) Microcell structures, wall materials, and methods of forming microcells; see for example U.S. Pat. Nos. 7,072,095 and 9,279,906; and (j) Methods for filling and sealing microcells; see for example U.S. Pat. Nos. 7,144,942 and 7,715,088.

Many of the aforementioned patents and applications recognize that the walls surrounding the discrete microcapsules in an encapsulated electrophoretic medium could be replaced by a continuous phase, thus producing a so-called polymer-dispersed electrophoretic display, in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned U.S. Pat. No. 6,866,760. Accordingly, for purposes of the present application, such polymer-dispersed electrophoretic media are regarded as sub-species of encapsulated electrophoretic media.

A related type of electrophoretic display is a microcell electrophoretic display, also known as MICROCUP®. In a microcell electrophoretic display, the charged particles and the fluid are not encapsulated within microcapsules but instead are retained within a plurality of cavities formed within a carrier medium, typically a polymeric film. See, for example, U.S. Pat. Nos. 6,672,921 and 6,788,449, both of which are incorporated by reference in their entireties.

Although electrophoretic media are often opaque (since, for example, in many electrophoretic media, the particles substantially block transmission of visible light through the display) and operate in a reflective mode, many electrophoretic displays can be made to operate in a so-called "shutter mode" in which one display state is substantially opaque and one is light-transmissive. See, for example, U.S. Pat. Nos. 5,872,552; 6,130,774; 6,144,361; 6,172,798; 6,271,823; 6,225,971; and 6,184,856. Dielectrophoretic displays, which are similar to electrophoretic displays but rely upon variations in electric field strength, can operate in a similar mode; see U.S. Pat. No. 4,418,346. Other types of electro-optic displays may also be capable of operating in shutter mode. Electro-optic media operating in shutter mode may be useful in multi-layer structures for full color displays; in such structures, at least one layer adjacent the viewing surface of the display operates in shutter mode to expose or conceal a second layer more distant from the viewing surface.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; ink jet printing processes; electrophoretic deposition (See U.S. Pat. No. 7,339,715); and other similar techniques.) Thus, the resulting display can be flexible. Further, because the display medium can be printed, using a variety of methods, the display itself can be made inexpensively.

The aforementioned U.S. Pat. No. 6,982,178 describes a method of assembling a solid electro-optic display (including an encapsulated electrophoretic display) which is well adapted for mass production. Essentially, this patent describes a so-called "front plane laminate" ("FPL") which comprises, in order, a light-transmissive electrically-conductive layer; a layer of a solid electro-optic medium in electrical contact with the electrically-conductive layer; an adhesive layer; and a release sheet. Typically, the light-transmissive electrically-conductive layer will be carried on a light-transmissive substrate, which is preferably flexible, in the sense that the substrate can be manually wrapped around a drum (say) 10 inches (254 mm) in diameter without permanent deformation. The term "light-transmissive" is used in this patent and herein to mean that the layer thus designated transmits sufficient light to enable an observer, looking through that layer, to observe the change in display states of the electro-optic medium, which will normally be viewed through the electrically-conductive layer and adjacent substrate (if present); in cases where the electro-optic medium displays a change in reflectivity at non-visible wavelengths, the term "light-transmissive" should of course be interpreted to refer to transmission of the relevant non-visible wavelengths. The substrate will typically be a polymeric film, and will normally have a thickness in the range of about 1 to about 25 mil (25 to 634 µm), preferably about 2 to about 10 mil (51 to 254 µm). The electrically-conductive layer is conveniently a thin metal or metal oxide layer of, for example, aluminum or ITO, or may be a conductive polymer. Poly (ethylene terephthalate) (PET) films coated with aluminum or ITO are available commercially, for example as "aluminized Mylar" ("Mylar" is a Registered Trade Mark) from E.I. du Pont de Nemours & Company, Wilmington Del., and such commercial materials may be used with good results in the front plane laminate.

Assembly of an electro-optic display using such a front plane laminate may be effected by removing the release sheet from the front plane laminate and contacting the adhesive layer with the backplane under conditions effective to cause the adhesive layer to adhere to the backplane, thereby securing the adhesive layer, layer of electro-optic medium and electrically-conductive layer to the backplane. This process is well-adapted to mass production since the front plane laminate may be mass produced, typically using roll-to-roll coating techniques, and then cut into pieces of any size needed for use with specific backplanes.

U.S. Pat. No. 7,561,324 describes a so-called "double release sheet" which is essentially a simplified version of the front plane laminate of the aforementioned U.S. Pat. No. 6,982,178. One form of the double release sheet comprises a layer of a solid electro-optic medium sandwiched between two adhesive layers, one or both of the adhesive layers being covered by a release sheet. Another form of the double release sheet comprises a layer of a solid electro-optic medium sandwiched between two release sheets. Both forms of the double release film are intended for use in a process generally similar to the process for assembling an electro-optic display from a front plane laminate already described, but involving two separate laminations; typically, in a first lamination the double release sheet is laminated to a front electrode to form a front sub-assembly, and then in a second lamination the front sub-assembly is laminated to a backplane to form the final display, although the order of these two laminations could be reversed if desired.

The subject matter presented herein, in particular, relates to piezo-electrophoretic display structural designs that do not need a power supply (e.g., battery or wired power supply, photovoltaic source, etc.) in order for the electrophoretic display to operate. The assembly of such an electrophoretic display is therefore simplified. In some embodiments, the piezoelectric material and the electrophoretic media are directly laminated together. The electrophoretic medium may be contained in microcells, microcapsules, or the electrophoretic medium may be dispersed in a polymer matrix, as described above. In some embodiments the piezoelectric material is polarized (i.e., written) with a high-voltage electric field after the piezo-electrophoretic film or piezo-electrophoretic display has been created, as discussed below.

Figure 1B:
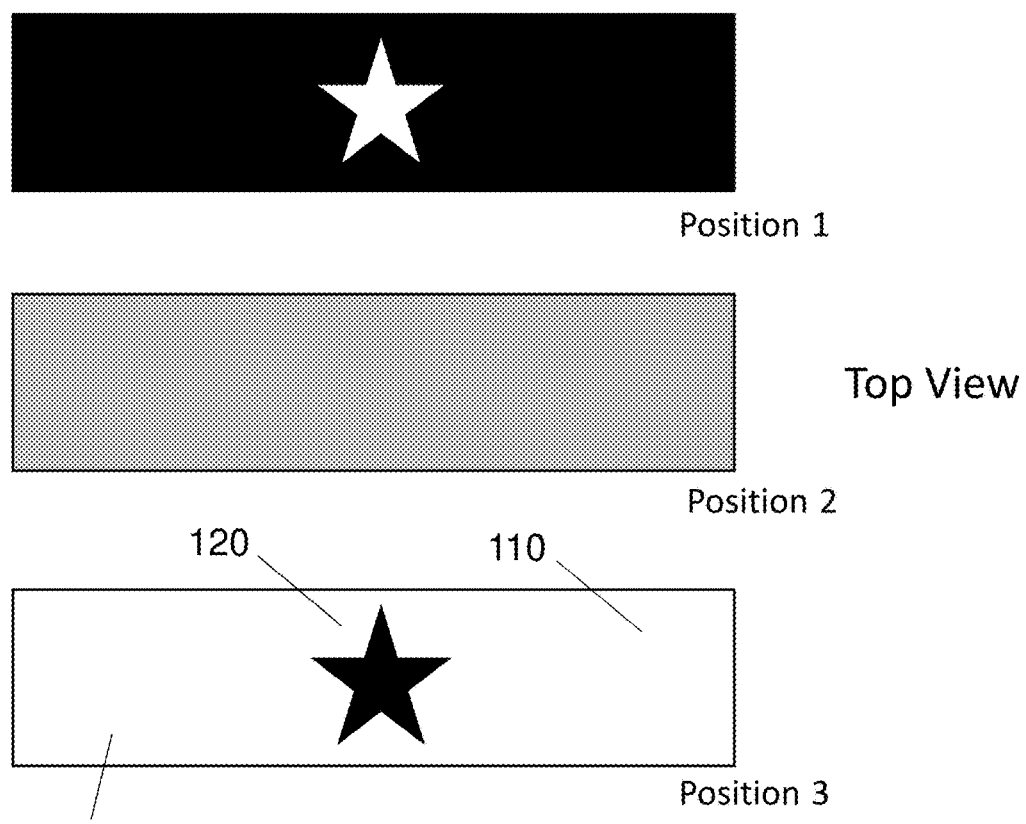
FIG. 1B shows a top view of a piezo-electrophoretic display film of the invention, which includes a star-shaped area of differential polarization. Three exemplary positions, convex, neutral, and concave, are shown from above. When the piezo-electrophoretic display film is flexed, the area of differential polarization results in the oppositely charged particles appearing at the viewing surface.

Piezoelectricity is the charge which accumulates in a solid material in response to applied mechanical stress. Suitable polymer materials for the subject matter disclosed herein may include polyvinylidene fluoride (PVDF), polyvinylidene chloride (PVDC), polyamides, and Parylene-C. Piezo-electrophoretic films and piezo-electrophoretic displays described herein use piezoelectricity to drive the charged pigments of an electrophoretic medium Thus, when the piezoelectric material coupled to an electrophoretic media layer is manipulated, the color of the electrophoretic material at the viewing surface changes. For example, by bending or introduce stress to a piece of piezo material, voltage may be generated and this voltage can be utilized to cause movement of the color pigments of the electrophoretic material. If segments of piezoelectric material with different polarizations are used, or if areas of differential polarization are created in a piezoelectric film, an electrophoretic medium having two types of oppositely-charged pigments can be used to create patterns with high contrast ratios, as shown in FIGS. 1A and 1B. As used herein, the term "contrast ratio" (CR) for an electro-optic display (e.g., an electrophoretic display) is defined as the ratio of the luminance of the brightest color (white) to that of the darkest color (black) that the display is capable of producing. Normally a high contrast ratio, or CR, is a desired aspect of a display.

FIGS. 1A and 1B illustrates side and top views of an exemplary piezo-electrophoretic display 100 in accordance with the subject matter disclosed herein. In this embodiment, a piezoelectric material of the invention is laminated to an electrophoretic medium layer (discussed below), and one or more electrodes are included to provide a suitable electric field to cause the electrophoretic particles to travel toward (or away from the viewing surface). In the embodiment shown in FIGS. 1A and 1, a second area 120 of the piezoelectric film of the piezo-electrophoretic display 100 has been polarized (poled) in a direction opposite the first area 110, thus when the piezo-electrophoretic display 100 is manipulated from a neutral state (position 2) to either a first (position 1) or a second (position 3) optical state, the first and second areas (110, 120) will achieve different colors in the two areas. In the instance of an electrophoretic medium having oppositely charged particle sets of black and white, a high contrast image will be formed, e.g., as shown in FIG. 1B. Because the first and second areas (110, 120) of the piezoelectric material can be polarized with good resolution (as discussed below), a variety of images/information can be encoded to "appear" when the piezo-electrophoretic display 100 is manipulated. For example, a security ribbon may be created that exists in a neutral state as a gray strip, but when the security ribbon is flexed, the ribbon will display a security seal, such as the star shape shown in FIG. 1B. Of course, the security seal may alternatively include a bar code, a number, a word, a phone number, and internet address, a QR code, a photograph, a half-tone image, or a logo.

Piezoelectric films of the invention include a piezoelectric polymer and less than 10% of an ionic liquid. The piezoelectric films have sufficient quantities of polarizable polymer domains to be useful as piezoelectric materials—without the need for stretching/pulling or a need for thermal treatments, such as annealing. The piezoelectric polymer can be polyvinylidene fluoride (PVDF), polyvinylidene chloride (PVDC), a polyamide, Parylene-C, or combinations thereof, however PVDF is preferred because it is commercially available in powdered and pellet form, e.g., from Sigma Aldrich or Arkema. Preferred formulations are available under the name brand KYNAR®. The PVDF may include copolymers such as trifluoroethylene (TrFE), hexafluoropropylene (HFP), and chlorotrifluoroethylene (CTFE). PVDF copolymers are also available as raw materials, however PVDF copolymers are typically 100 to 10,000 times as expensive as simple PVDF. The ionic liquids may be present in the final film in a concentration of 10% or less by weight of ionic liquid versus weight of polymer, but active piezoelectric films with concentrations of 5% or less by weight of ionic liquid, e.g., 2% or less by weight of ionic liquid, e.g., 1% or less by weight of ionic liquid, e.g., 0.5% or less by weight of ionic liquid, e.g., 0.1% or less by weight of ionic liquid, e.g., 500 ppm or less by weight of ionic liquid, e.g., 250 ppm or less by weight of ionic liquid, e.g., 100 ppm or less by weight of ionic liquid. The piezoelectric films can be made quite thin, e.g., 10 µm or less, e.g., 7 µm or less, e.g., 5 µm or less, e.g., 3 µm or less, e.g., about 1 µm thick. Using such films it is possible to create piezo-electrophoretic films of 100 µm or less, e.g., as discussed below.

Suitable ionic liquids for incorporation into piezoelectric films of the invention include alkyl-substituted imidazolium cations, alkyl-substituted pyridinium cations, N-heterocyclic cations derived from pyridine, fluorinated counter anions, sulfated counter anions, dicyanamides ($N(CN)_2$), quaternary ammonium cations, or combinations thereof. For example, the alkyl-substituted imidazolium cations may include 1-Butyl-3-methylimidazolium (BMIM), 1-Ethyl-3-methylimidazolium (EMIM), 1-butyl-2,3-dimethylimidazolium (DBMIM), 1-octyl-3-methylimidazolium (OMIM), 1,3-di(N,N-dimethylaminoethyl)-2-methylimidazolium (DAMI), 1-decyl-3-methylimidazolium (DMIM), 1-dodecyl-3-methyl-dodecylimidazolium), and 1-butyl-2,3-dimethylimidazolium (BMMIM). The N-heterocyclic cations derived from pyridine may include 4-methyl-N-butyl-pyridinium (MBPy) or N-octylpyridinium ($C_8Py$). The fluorinated counter anions may include tetrafluoroborate (BF4), hexafluorophosphate ($PF_6$), bis-trifluoromethanesulfonimide ($NTf_2$), or trifluoromethanesulfonate (OTf). The quaternary ammonium cations may include tetraethylammonium (TEA) or tetrabutylammonium (TBA). The sulfated counter anions may include hydrogen sulfate (HSO$_4$), methyl sulfate (MeOSO$_3$), trifluoromethyl sulfate (CF$_3$OSO$_3$), ethyl sulfate (EtOSO$_3$), or perfluoroethyl sulfate (CF$_3$CF$_2$OSO$_3$). In preferred embodiment, the ionic liquid is 1-ethyl-3-methylimidazolium tetrafluoroborate (EMIM) (BF$_4$). EMIM-BF$_4$ is commercially available from Sigma Aldrich.

Figure 11:
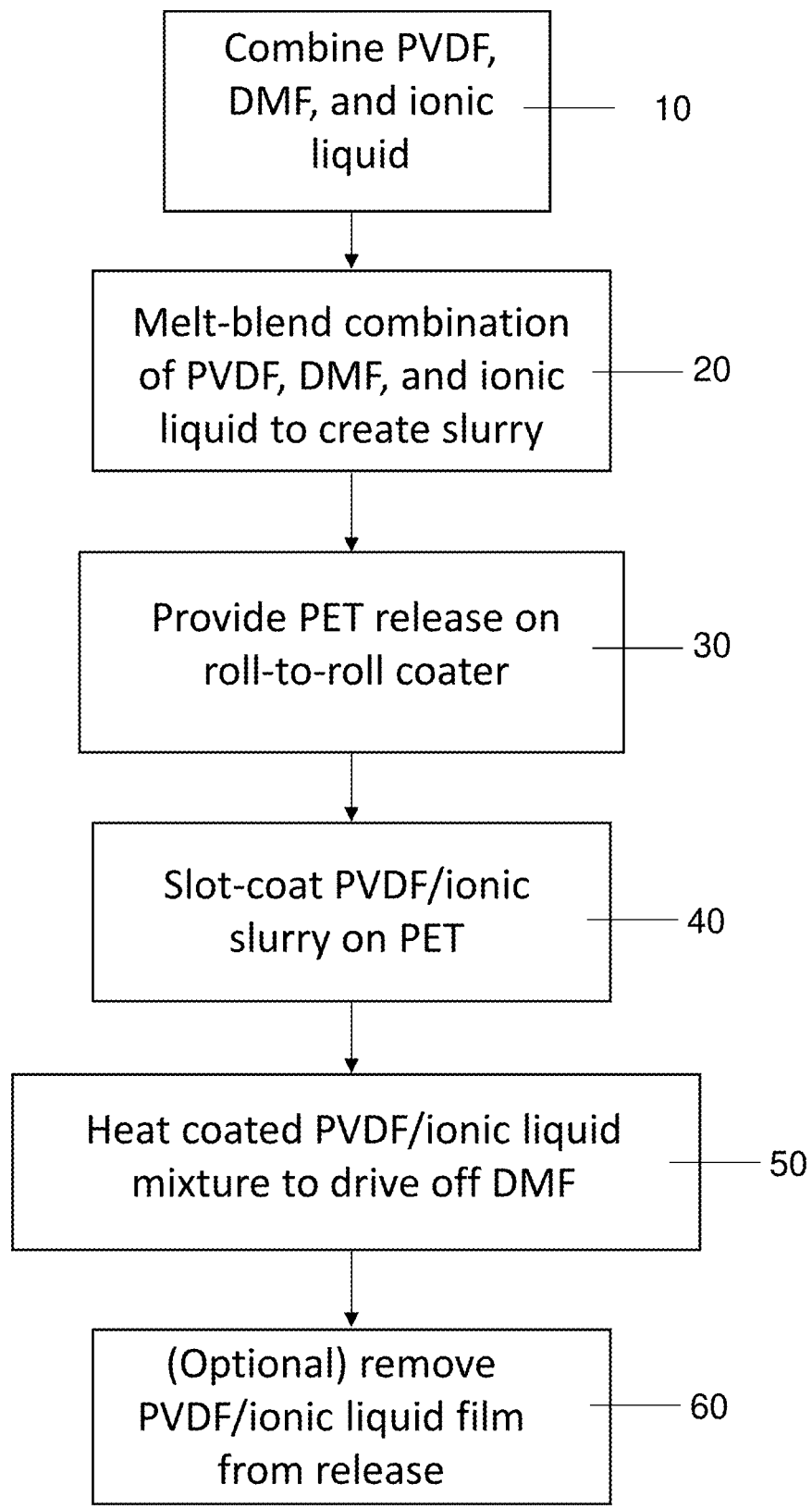
FIG. 11 details a method for creating a piezoelectric film including ionic liquids.

An exemplary method for creating a piezoelectric film with ionic liquids is shown in FIG. 11. The method begins by combining raw piezoelectric polymer (or raw piezoelectric copolymer) with an aprotic solvent (such as dimethylformamide (DMF), dimethylacetamide, dimethylsulfoxide (DMSO), or 1-methy-2-pyrrolidone(NMP)) with a suitable amount of ionic liquid, as in step 10. In preferred embodiments, the piezoelectric polymer is PVDF, the aprotic solvent is DMF, and the ionic liquid is 1-ethyl-3-methylimidazolium tetrafluoroborate (EMIM) (BF$_4$). The ingredients are blended together with heating to create a slurry, as shown at step 20. Typically, only 2-10% by weight of aprotic solvent is necessary to produce a usable melt. The ingredients need only be heated to about 70° C. with regular stirring, such as with a Teflon paddle. It is also possible to create a melt of only PVDF and (EMIM) (BF$_4$) by starting with a dry mixture (i.e., no solvent) and elevating the temperature to about 180° C., however casting this hot mixture requires specially-fabricated dies. Once the slurry is prepared, it can be cast on a web/release using roll to roll methods of the type described in U.S. Pat. No. 6,930,818, incorporated by reference in its entirety. In preferred embodiments, the web/release is PET and the slot-die is only about 5 μm above the surface of the web (see steps 30 and 40). The web with the cast piezoelectric polymer/ionic liquid slurry then moves to an oven region, where the DMF is driven off with heat (around 160° C.), as shown in step 50. The coated web is allowed to cool, at which point the piezoelectric film comprising ionic liquid can be peeled off from the web, or the web can be sliced into portions for later use, i.e., as shown in step 60.

The resulting piezoelectric material has a high proportion of beta phase (see Example) and can be polarized with a localized strong electric field, as shown in FIGS. 2A-3D. As discussed above, it is known that piezoelectric films can be stimulated to move between polarization states with a variety of external stresses, such as mechanical stretching, heat, electromagnetic fields, and applied force. The piezoelectric effect is closely related to the occurrence of electric dipole moments in solids. The dipole density or polarization (P) corresponds to the dipole moments per volume of the crystallographic unit cell, typically measured in C/m$^2$. The resulting dipole density, P, is a vector field, specific for a particular region of the material (i.e., differential polarization). Similar to magnets, dipoles near each other tend to be aligned in regions (Weiss domains). The Weiss domains in piezoelectric films of the invention are predominantly clusters of beta phase that are co-aligned. When first created, the domains within the larger film are usually randomly oriented (into an out of the film surface, sideways, etc.). However, using a variety of multi-step processes, the domains can be aligned producing localized areas of differential polarization. The process of aligned these regions is known as poling.

Figure 2A:
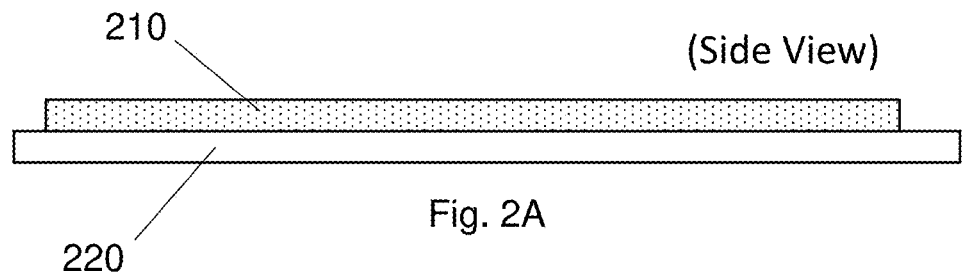
FIG. 2A shows an exemplary thin layer of piezoelectric material on a substrate.
Figure 2B:
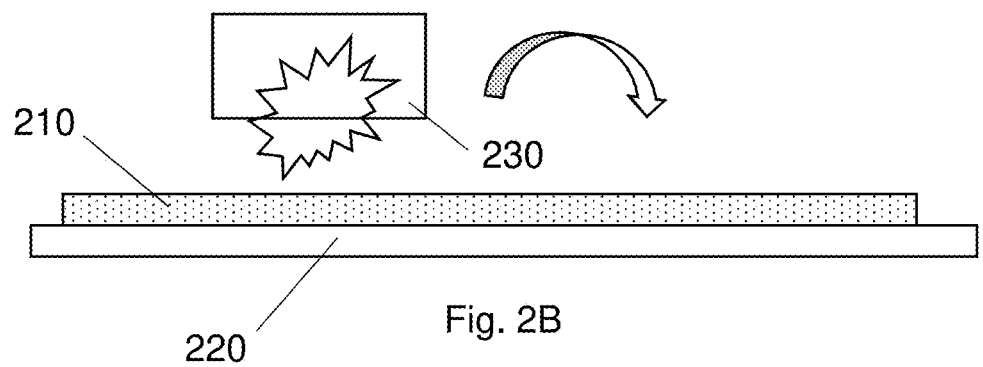
FIG. 2B exemplifies a method for creating areas of differential polarization in the thin layer of piezoelectric material by using the strong electric fields of a corona discharge. By moving the piezoelectric material closer and further from the discharge, the amount of polarization can be controlled spatially.
Figure 2C:
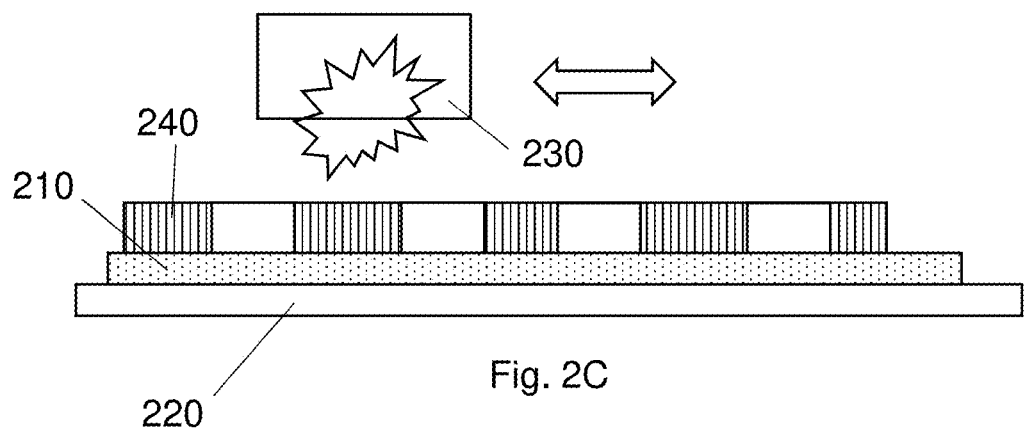
FIG. 2C exemplifies a method for creating areas of differential polarization in the thin layer of piezoelectric material by using the strong electric fields of a corona discharge. A conductive mask is used to pattern the piezoelectric material to create areas of differential polarization.

An exemplary method for poling a thin film of piezoelectric polymer with ionic liquid is illustrated in FIGS. 2A-2D. As shown in FIGS. 2B and 2C, the thin film of piezoelectric material 210 can be poled with a high voltage corona discharge 230 with spatial focus. Suitable corona discharge equipment is available from, e.g., Simco-Ion (Alameda, Calif.). Such devices can create localized 10-50 kV fields, e.g., 30 kV fields, e.g., 20 kV fields that can be brought within a few μm of the piezo material that will be poled. The spatial focus can be accomplished with steering electric fields and/or gas flow which focus/steer the flow of ions emanating from the corona discharge. As shown in FIG. 2B, the high-voltage corona discharge 230 can be moved in three dimensions to create areas of differential polarization, i.e., to pattern the piezoelectric material 210. Alternatively, the piezoelectric material 210 can be mounted on an XYZ stage allowing the film work piece to approach the high voltage corona discharge 230 in a controlled fashion. In an alternative embodiment, a conductive mask 240 can be used to protect areas of the piezoelectric material 210 from the high voltage corona discharge 230, as shown in FIG. 2C. A conductive mask may be fabricated from, e.g., conductive stainless steel or another conductive material that can withstand proximity to the corona discharge. Alternative masks, made from charge-absorbing or charge-blocking materials, such as glass, plastic, or rubber will also work. When the high voltage corona discharge 230 is moved over the thin film of piezoelectric material 210, the thin film of piezoelectric material 210 is poled only in the areas where the conductive mask 240 is not covering the thin film of piezoelectric material 210. Additionally, the polarity of the high voltage corona discharge 230 can be reversed, so that some areas can be polarized in a first direction, some areas are polarized in a second direction, and some areas are randomly polarized or unpolarized. See also FIGS. 3A-3D.

Figure 2D:
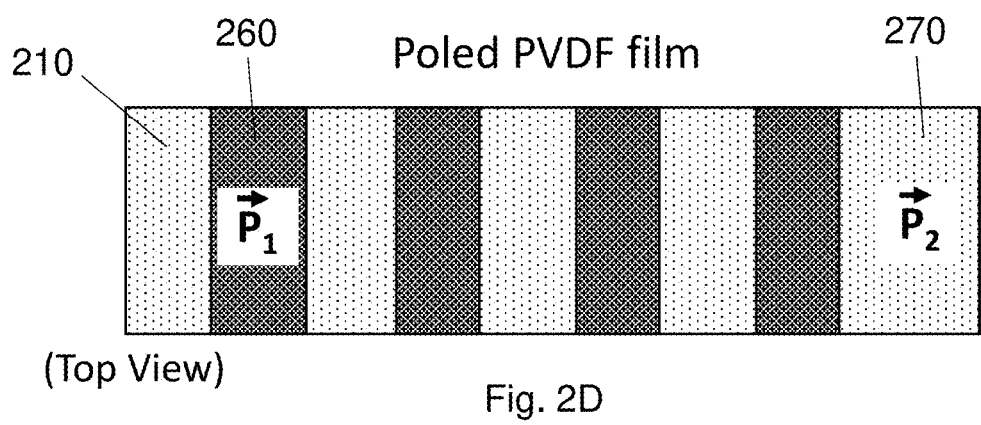
FIG. 2D illustrates a polarization (poling) pattern that can be achieved with the methods of FIG. 2B and FIG. 2C.

Using the techniques shown in FIGS. 2B and 2C, it is straightforward to create a thin film of piezoelectric material 210 with areas of differential polarization P1 and P2, shown as 260 and 270 in FIG. 2D. The areas of differential polarization 260 and 270 do not necessarily have opposite polarities of equal magnitude, however such an arrangement is common to provide better contrast ratios when a two-particle electrophoretic medium is used in conjunction with thin film of piezoelectric material 210. For example, as shown in 2D, the first area 260 may be polarized toward the viewer, while the second area 270 may be polarized away from the viewer. This techniques is further illustrated in FIGS. 3A-3D, which show how a single area 360 of a thin film of piezoelectric material deposited on a substrate 320 can be poled to have a polarization vector coming out of the page, as shown in FIG. 3B. Accordingly, when the thin film of piezoelectric material is manipulated (flexed) it will preferentially drive one polarity of electrophoretic particles toward a viewing surface. As shown in FIG. 3C, a second area 370 of the thin film of piezoelectric material can be polarized in a different direction, with or without the addition of a conductive mask 340, resulting in some patterned combination of polarity and magnitude, as needed for the application. As shown in FIG. 3D some portions of are 370 are polarized into the viewing surface, but with shadows created by the conductive mask 340. Accordingly when the piezoelectric material is manipulated (flexed) it will preferentially drive one polarity of electrophoretic particles toward a viewing surface, except in the areas where the polarization has been masked, which will remain in a neutral color stage, thereby giving rise to a pattern, e.g., a security seal.

Figure 4A:
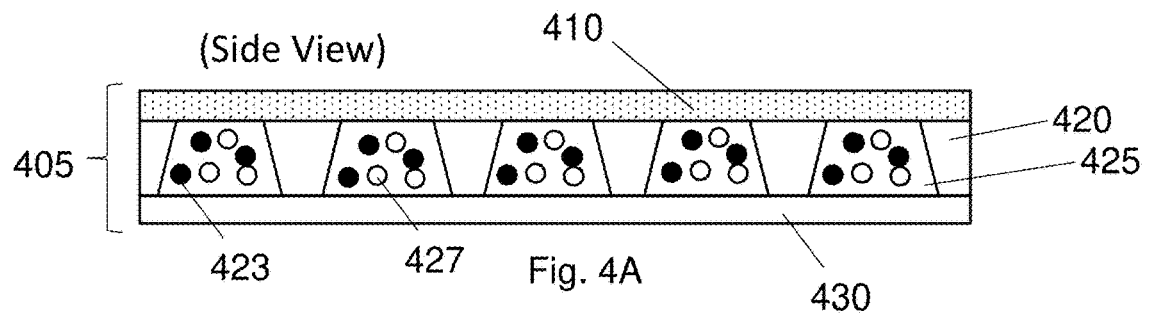
FIG. 4A shows an exemplary thin layer of a piezo-microcell precursor film on a substrate.

FIGS. 2A-3D illustrate the various techniques that can be used to create areas of differential polarization in an a thin film of piezoelectric material 210. As illustrated in FIGS. 4A-4D, these same techniques can be used to create areas of differential polarization in a thin piezo-electrophoretic medium film 405 as well. As shown in FIG. 4A, a thin film of piezoelectric material 410 can be coupled to a layer of electrophoretic microcells 420 to create a piezo-electrophoretic medium film 405. The thin film of piezoelectric material 410 can be coupled to a layer of electrophoretic microcells 420 with an adhesive layer (not shown) or the thin film of piezoelectric material 410 can be slot-coated directly to the layer of electrophoretic microcells 420, i.e., as discussed above with respect to FIG. 2A. The electrophoretic microcells 420 are typically formed from a polymer, such as a acrylates, vinyl ethers, or epoxides, as described in detail in, for example, U.S. Pat. Nos. 6,930,818, 7,052,571, 7,616,374, 8,361,356, and 8,830,561, all of which are incorporated by reference in their entireties. In some embodiments, the layer of electrophoretic microcells 420 may be filled with an electrophoretic medium 425 including two or more electrophoretic particles 423 and 427, which typically have different electrophoretic mobilities and optical properties. The electrophoretic medium 425 may be sealed with a sealing layer 430, preferably a water-soluble sealing layer as described in U.S. Pat. Nos. 7,560,004, 7,572,491, 9,759,978, or 10,087,344, all of which are incorporated by reference in their entireties. In some embodiments, the layer of electrophoretic microcells 420 is created on a release, filled with electrophoretic medium 425 and sealed with sealing layer 430, and then the filled and sealed electrophoretic microcells 420 are used as the substrate for the creation of the thin film of piezoelectric material 410. The resulting structure is a thin piezo-electrophoretic medium film 405. In other embodiments the thin film of piezoelectric material 410 is laminated to an acrylate, vinyl ether, or epoxide film that is a precursor to a layer of electrophoretic microcells 420. The combined thin film of piezoelectric material 410 and precursor material is then embossed on the precursor side (discussed below), and subsequently filled with electrophoretic medium 425 and sealed with sealing layer 430 in order to produce a thin piezo-electrophoretic medium film 405. In yet another embodiment (not shown in FIGS. 4A-4D), a complete microcell front plane laminate, of the type described in U.S. Pat. No. 7,158,282 and available commercially from E Ink Corporation, can be used as the substrate for a thin film of piezoelectric material 410, which can be poled as described below. Notably, when a front plane laminate material is used, the final structure additionally includes a conductive layer, which is typically light-transmissive. The front plane laminate can be oriented so that the light-transmissive electrode layer is in contact with the thin film of piezoelectric material 410, or the front plane laminate can be flipped over so that the sealing layer is in contact with the thin film of piezoelectric material 410.

Figure 4B:
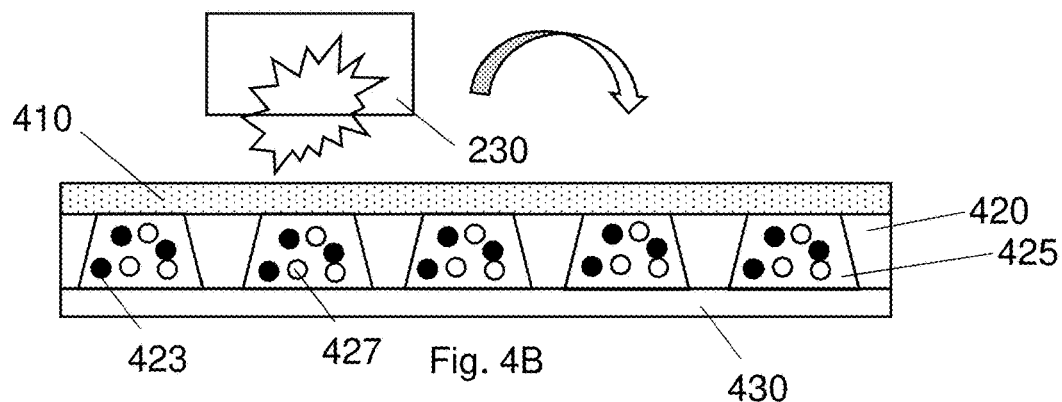
FIG. 4B exemplifies a method for creating areas of differential polarization in the thin layer of piezoelectric material of a piezo-microcell precursor film by using the strong electric fields of a corona discharge. By moving the piezo-microcell precursor film closer and further from the discharge, the amount of polarization can be controlled spatially.
Figure 4C:
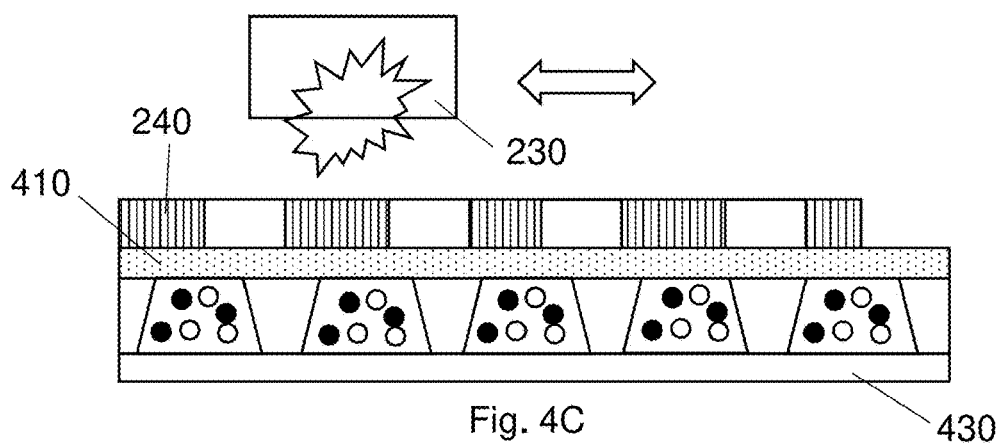
FIG. 4C exemplifies a method for creating areas of differential polarization in the thin layer of piezoelectric material of a piezo-microcell precursor film by using the strong electric fields of a corona discharge. A conductive mask is used to pattern the piezoelectric material of the piezo-microcell precursor film to create areas of differential polarization.
Figure 4D:
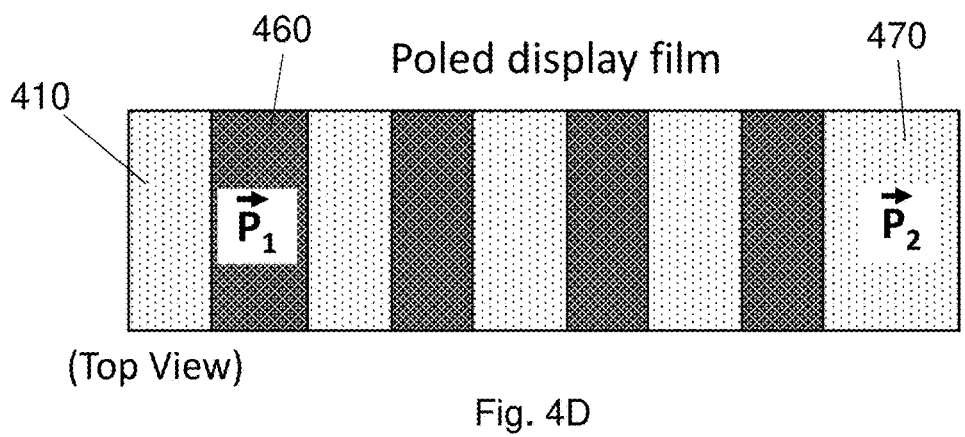
FIG. 4D illustrates a polarization (poling) pattern in a piezo-microcell precursor film that can be achieved with the methods of FIG. 3B and FIG. 3C.

Once the thin piezo-electrophoretic medium film 405 has been created, thin film of piezoelectric material 410 can be addressed as described above with respect to FIGS. 2A-3D. That is the thin film of piezoelectric material 410 can be poled with a high voltage corona discharge 230 with spatial focus, as shown in FIG. 4B, e.g., by mounting the thin piezo-electrophoretic medium film 405 on an XYZ stage allowing the film work piece to approach the high voltage corona discharge 230 in a controlled fashion. In an alternative embodiment, a conductive mask 240 can be used to protect areas of thin piezo-electrophoretic medium film 405 from the high voltage corona discharge 230, as shown in FIG. 4C. As discussed with respect to FIG. 2A-3D, the polarity of the high voltage corona discharge 230 can be reversed, so that some areas can be polarized in a first direction, some areas are polarized in a second direction, and some areas are randomly polarized or unpolarized. Like FIG. 2D above, poling the thin film of piezoelectric material 410 in the thin piezo-electrophoretic medium film 405 results in areas of differential polarization P1 and P2, shown as 460 and 470 in FIG. 4D. Importantly, because the thin piezo-electrophoretic medium film 405 can be fabricated before poling, it is feasible for an end-customer to control the final step of creating the desired poling design in the thin piezo-electrophoretic medium film 405. Thus, if the final product will include a security seal or serial number, the security seal or serial number can be placed after the final product has been completed and verified, etc. For example, a United States $100 bill may be printed at the United States Treasury with a serial number in metallic ink at the same time that a security ribbon comprising a thin piezo-electrophoretic medium film 405 is poled to create a verification code corresponding to the serial number. This feature eliminates many logistical problems, and associated costs, because it is not necessary to, for example, match a prefabricated security marker with a specific product further downstream in the supply chain.

The techniques described above can be used to achieve a great variety of thin piezo-electrophoretic films as described in the following figures.

As shown in FIGS. 5A-6B and 8A-10C, a piezo-electrophoretic film or a piezo-electrophoretic display includes a layered stack of some number of components including a thin piezo-electric film and a layer of electrophoretic media. The piezoelectric material can be PVDF-EMIM-BF$_4$, however any of the materials listed above can be used because they can be fabricated into very thin films. The electrophoretic media typically includes one or more sets of charged particles that move through a non-polar solvent in the presence of an electric field. The electrophoretic media is typically contained, i.e., in microcapsules, microcells, or dispersed droplets. The electrophoretic media can also be contained in open troughs or wells which are sealed in a larger flexible container. The piezo-electrophoretic films and piezo-electrophoretic displays exemplified herein can be made quite thin, e.g., 100 µm thick or less, e.g., 70 µm thick or less, e.g., 50 µm thick or less, e.g., 35 µm thick or less, e.g., 20 µm thick or less, e.g., 10 µm thick or less. Such thin materials are able to flex without breaking or leaking and are also not noticeable when incorporated into final products, such as paper or a bank note. Additionally, many of the piezo-electrophoretic film or a piezo-electrophoretic displays include layers that are all light-transmissive and/or sufficiently thin to be light transmissive thus allowing the piezo-electrophoretic response to be viewed from above and below. In such piezo-electrophoretic film or a piezo-electrophoretic displays, when a first image is viewable from the top surface, e.g., Position 1 of FIG. 1B, the bottom surface will typically show the negative, e.g., Position 3 of FIG. 1B. However, when incorporating electrophoretic media with more than two types of particles, the top and bottom may not show reversed images due to mixed particle states at one of the two surfaces.

A piezo-electrophoretic film or a piezo-electrophoretic display will often include at least one electrode layer, which may be light-transmissive, and which may be flexible. Suitable materials include commercial ITO-coated PET, which may be used as substrate for manufacturing. In some other embodiments, flexible and transparent conductive coatings including other transparent conductive oxides (TCOs) may be used, such as, zinc oxide, zinc tin oxide, indium zinc oxide, aluminum zinc oxide, indium tin zirconium oxide, indium gallium oxide, indium gallium zinc oxide, or fluorinated variants of these oxides such as fluorine-doped tin oxide. In many of the embodiments described herein, poly(3,4-ethylenedioxythiophene) polystyrene sulfonate (PEDOT:PSS) is used because it has excellent bending properties and is optically transparent. While the overall conductivity is not as high as, e.g., PET/ITO, PEDOT:PSS is sufficient to provide the necessary electric field to drive the electrophoretic particles in the electrophoretic medium. Other materials include polymers, typically light-transmissive polymers, that are doped with conductive materials such as carbon black, metal flakes, metal whiskers, carbon nanotubes, silicon nitride nanotubes, or graphene. In some instances, the electrode layer is a metal film, such as a copper, silver, gold, or aluminum film or foil. Metal-coated polymer films may also be suitable for use as an electrode layer. The resistance of the electrode layer may be at 500 Ohm-m or less, e.g., 100 Ohm-m or less, e.g., 1 Ohm-m or less, e.g., 0.1 Ohm-m or less, e.g., 0.01 Ohm-m or less. (For comparison the electrophoretic medium layer typically has a resistance of approximately $10^7$ to $10^8$ Ohm-m, and the piezoelectric material has a resistance of $10^{11}$ to $10^{14}$ Ohm-m.)

A piezo-electrophoretic film or a piezo-electrophoretic display will often include at least one adhesive layer, formed from a polymer such as an acrylic or a polyurethane. polyurethanes, polyureas, polycarbonates, polyamides, polyesters, polycaprolactones, polyvinyl alcohol, polyethers, polyvinyl acetate derivatives such as poly(ethylene-co-vinylacetate], polyvinyl fluoride, polyvinylidene fluoride, polyvinyl butyral, polyvinylpyrrolidone, poly(2-ethyl-2-oxazoline), acrylic or methacrylic copolymers, maleic anhydride copolymers, vinyl ether copolymers, styrene copolymers, diene copolymers, siloxane copolymers, cellulose derivatives, gum Arabic, alginate, lecithin, polymers derived from amino acids, and the like. The adhesives may additionally include one or more low dielectric polymers or oligomers, ionic liquids, or conductive fillers such as carbon black, metal flakes, metal whiskers, carbon nanotubes, silicon nitride nanotubes, or graphene. Adhesives including such charged and/or conducting materials are conductive adhesives. The polymers and oligomers used in the adhesive layer may have functional group(s) for chain extension or crosslinking during or after lamination. The adhesive layer may have a resistivity value of roughly $10^6$ Ohm*cm to $10^8$ Ohm*cm, preferably less than $10^{12}$ Ohm*cm.

Among the polymers and oligomers mentioned above, polyurethanes, polyureas, polycarbonates, polyesters and polyamides, especially those comprising a functional group, are particularly preferred because of their superior adhesion and optical properties and high environmental resistance. Examples for the functional groups may include, but are not limited to, —OH, —SH, —NCO, —NCS, —NHR, —NR-CONHR, —NRCSNHR, vinyl or epoxide and derivatives thereof, including cyclic derivatives. The "R" in the functional groups mentioned above may be hydrogen or alkyl, aryl, alkylaryl or arylalkyl of up to 20 carbon atoms which alkyl, aryl, alkylaryl or arylalkyl may be optionally substituted or interrupted by N, S, O or a halogen. The "R" preferably is hydrogen, methyl, ethyl, phenyl, hydroxymethyl, hydroxyethyl, hydroxybutyl or the like. Functionalized polyurethanes, such as hydroxyl terminated polyester polyurethanes or polyether polyurethanes, isocyanate terminated polyester polyurethanes or polyether polyurethanes or acrylate terminated polyester polyurethanes or polyether polyurethanes are particularly preferred.

In many embodiments, a piezo-electrophoretic film or a piezo-electrophoretic display will often include a release sheet. The release may be use temporarily to facilitate processing piezo-electrophoretic film or a piezo-electrophoretic display, e.g., when embossing, filling, cutting, etc. In other embodiments the release may be used to deliver a final piezo-electrophoretic film or a piezo-electrophoretic display that will be adhered to a final product. In some instances the release will protect a functional adhesive layer that will be used to manipulate the piezo-electrophoretic film or a piezo-electrophoretic display prior to the piezo-electrophoretic film or a piezo-electrophoretic display being disposed in a final product. The release may be formed from a material selected from the group consisting of polyethylene terephthalate (PET), polycarbonate, polyethylene (PE), polypropylene (PP), paper and a laminated or cladding film thereof. The release may also be metalized to facilitate quality control measurements and/or to control static electricity during handling, shipping, and downstream incorporation into products. In some embodiments, a silicone release coating may be applied onto the release to improve the release properties.

While not shown in FIGS. 5A-6B and 8A-10C, a piezo-electrophoretic film or a piezo-electrophoretic display may also include an additional edge seal and/or barrier material to allow the a piezo-electrophoretic film or a piezo-electrophoretic display to maintain the desired humidity level and to prevent leakage of e.g., non-polar solvent or adhesive, and to prevent ingress of water, dirt, or gasses. The barrier materials can be any flexible material, typically a polymer with low to negligible WVTR (water vapor transmission rate). Suitable materials include polyethylene terephthalate, polyethylene naphthalate, polycarbonate, polyimides, cyclic olefins, and combinations thereof. If the piezo-electrophoretic film or a piezo-electrophoretic display will be exposed to particularly harsh conditions, a flexible glass such as WILLOW® glass (Corning, Inc.) may be used for the barrier layer. The edge seal can be a metallized foil or other barrier foil adhered over the edge of the piezo-electrophoretic film or a piezo-electrophoretic display. The edge seal may also be formed from dispensed sealants (thermal, chemical, and/or radiation cured), polyisobutylene or acrylate-based sealants, which may be cross-linked. In some embodiments, the edge seal may be a sputtered ceramic, such as alumina or indium tin oxide, or advanced ceramics such as available from Vitex Systems, Inc. (San Jose, Calif.).

Figures 5A, 5B, 5C, 5D:
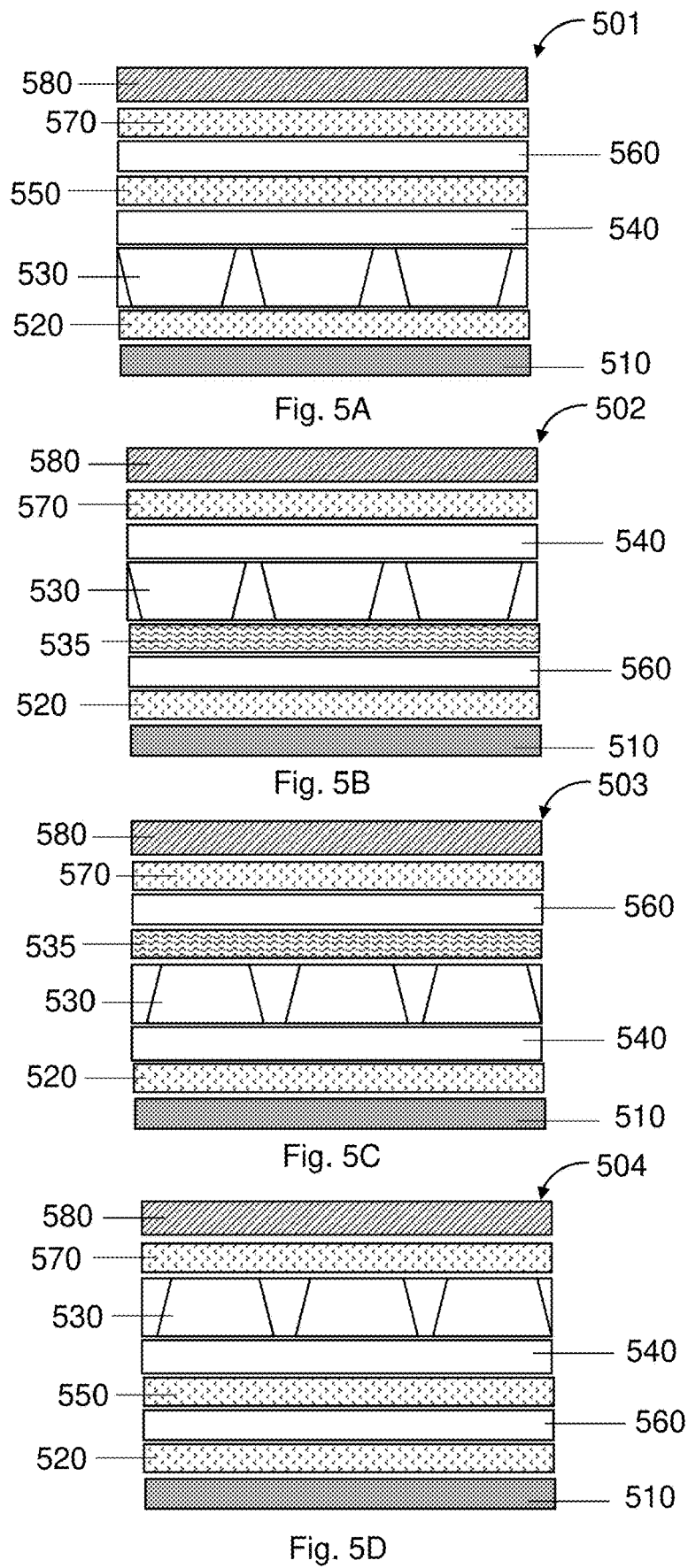
FIG. 5A is a schematic cross section of an embodiment of a piezo-electrophoretic film.
FIG. 5B is a schematic cross section of an embodiment of a piezo-electrophoretic film.
FIG. 5C is a schematic cross section of an embodiment of a piezo-electrophoretic film.
FIG. 5D is a schematic cross section of an embodiment of a piezo-electrophoretic film.

In general, the layers of a piezo-electrophoretic film 501-504 can be arranged/laminated in the order that produces the best performance for an end application. For example, as shown in FIG. 5A, a piezo-electrophoretic film 501, may be prepared by disposing a microcell precursor material on a release 510, including a release adhesive 520. The microcell precursor can then be embossed or photolithographed to create an array of microcells 530. The microcells 530 may be thermally cured or cured with electromagnetic radiation, such as U.V. light. The microcells 530 can then be filled with electrophoretic media and sealed with a sealing layer 540, as discussed above with respect to FIG. 4A. (It is to be understood that microcells 530 adjacent a sealing layer 540 are filled with an electrophoretic medium including charged particles in a non-polar solvent even though the electrophoretic media are not shown in the subsequent figures.) A piezoelectric layer 560 can be laminated to the sealing layer 540 using an adhesive 550, which will typically be an optically-clear adhesive formed from one of the materials listed above. Finally, a flexible electrode 580 will be coupled to the piezo-electrophoretic film with a conductive adhesive 570. Such a piezo-electrophoretic film 501 may be subsequently manipulated by handling release 510 until such a time as the stack, minus release 510, is affixed to a final product. In the piezo-electrophoretic film 501 the piezoelectric layer 560 is typically poled to create areas of differential polarization before the flexible electrode 580 is coupled to the piezo-electrophoretic film. In some embodiments the flexible electrode 580 and the conductive adhesive 570 can be replaced with a thin layer of a transparent conductive oxide, such as ITO. The ITO can be sputtered directly onto the piezoelectric layer 560.

Closely-related, but alternative stacks are shown in FIGS. 5B-5D. In FIG. 5B, a piezo-electrophoretic film 502 is created in which a piezoelectric layer 560 is prepared prior to fabrication on a separate release 510. For example, the piezoelectric layer 560 may be a PVDF-ionic liquid film that was poled to create a security pattern. The piezoelectric layer 560 is then coupled to a sealed microcell layer 530, which has been coupled to a flexible electrode 580. Notably, in piezo-electrophoretic film 502, the openings of the microcell layer 530 face away from the piezoelectric layer 560, which can facilitate a good bond between the microcell layer 530 and the piezoelectric layer 560. This bond may be improved with the introduction of a primer 535 to improve adhesion of the piezoelectric layer 560 to the microcell material, typically a polymer comprising acrylates, vinyl ethers, or epoxides. The primer 535 may be a polar oligomeric or polymeric material, such as polyhydroxy functionalized polyester acrylates (e.g., BOMAR® BDE 1025 from Dymax) or alkoxylated acrylates, such as ethoxylated nonyl phenol acrylate (e.g., SR504 from Sartomer), ethoxylated trimethylolpropane triacrylate (e.g., SR9035 from Sartomer) or ethoxylated pentaerythritol tetraacrylate (e.g., SR494 from Sartomer). Examples of polar polymers suitable for use a primer 535 include solvent urethane polymers, such as Irostic® polymers.

Of course, it is also possible to build the stack such that the openings of the microcell layer 530 face toward the piezoelectric layer 560, as in piezo-electrophoretic film 504 illustrated in FIG. 5D. As a further alternative, shown in FIG. 5C, piezo-electrophoretic film 503 is arranged such that the openings of the microcell layer 530 face away from the piezoelectric layer 560, however the piezoelectric layer 560 is coupled directly to the flexible electrode 580.

Figure 6A:
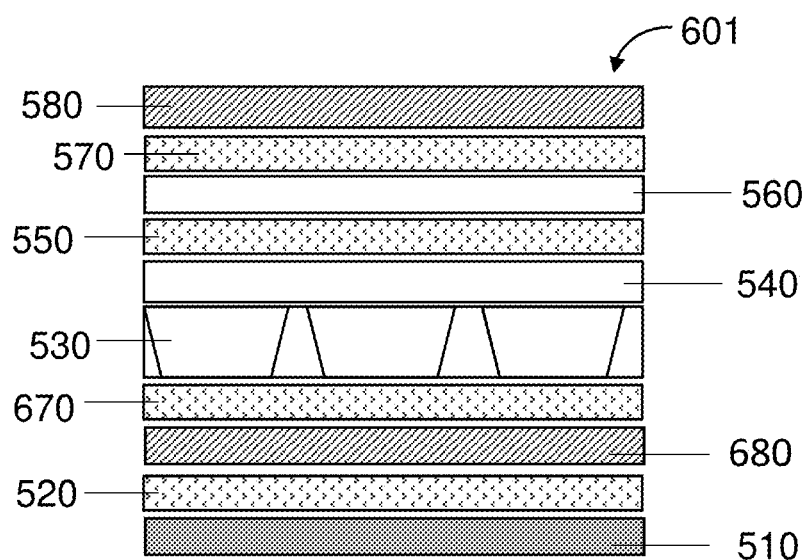
FIG. 6A is a schematic cross section of an embodiment of a piezo-electrophoretic display.
Figure 6B:
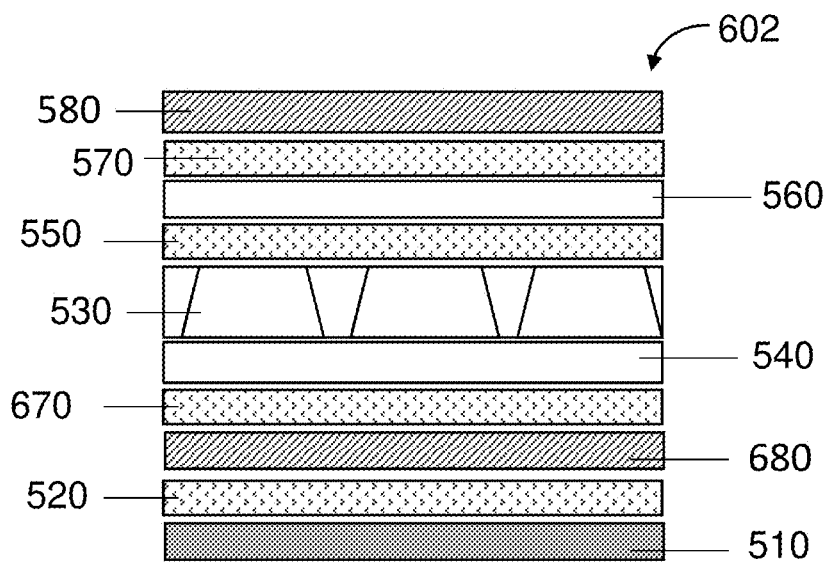
FIG. 6B is a schematic cross section of an embodiment of a piezo-electrophoretic display.

The piezo-electrophoretic films (501, 502, 503, 504) shown in FIGS. 5A-5D can be transformed to piezo-electrophoretic displays (601, 602) with the addition of a second flexible electrode 680 in place of the release layer in FIGS. 5A-5D. Piezo-electrophoretic displays (601, 602) typically will also include a second conductive adhesive 670, however it should be noted that in some instances the conductive adhesive 670, alone, may be sufficient to provide the necessary electric field to switch the electrophoretic material. Additionally, it is possible to directly coat the bottom of the microcell layer 530 (FIG. 6A) or the sealing layer 540 (FIG. 6B) with a thin layer of a transparent conductive oxide to create a second electrode. Also, if it is not necessary to see through both the top and bottom of the piezo-electrophoretic displays (601, 602), a conductive metal foil can be used as the second flexible electrode 680. As shown in FIGS. 6A and 6B, it is typical to add a release 510 to the completed piezo-electrophoretic displays (601, 602) to improve handling, and the provide a ready-to-use adhesive to affix the piezo-electrophoretic displays (601, 602). In some embodiments, a piezo-electrophoretic display 601 can be formed by simply bonding a piezoelectric layer 560 to a commercial front plane laminate including the second flexible electrode 680 and a sealed microcell layer 530 including an electrophoretic medium. In such instances, the piezoelectric layer 560 is typically poled to create areas of differential polarization before the front plane laminate is coupled to the piezoelectric layer 560. While piezo-electrophoretic displays (601, 602) of FIGS. 6A and 6B are shown with the piezoelectric layer 560 above the sealed microcell layer 530, it is to be understood that the piezoelectric layer 560 can also be placed below the sealed microcell layer 530 to create piezo-electrophoretic displays analogous to FIGS. 5B and 5D.

Figure 7:
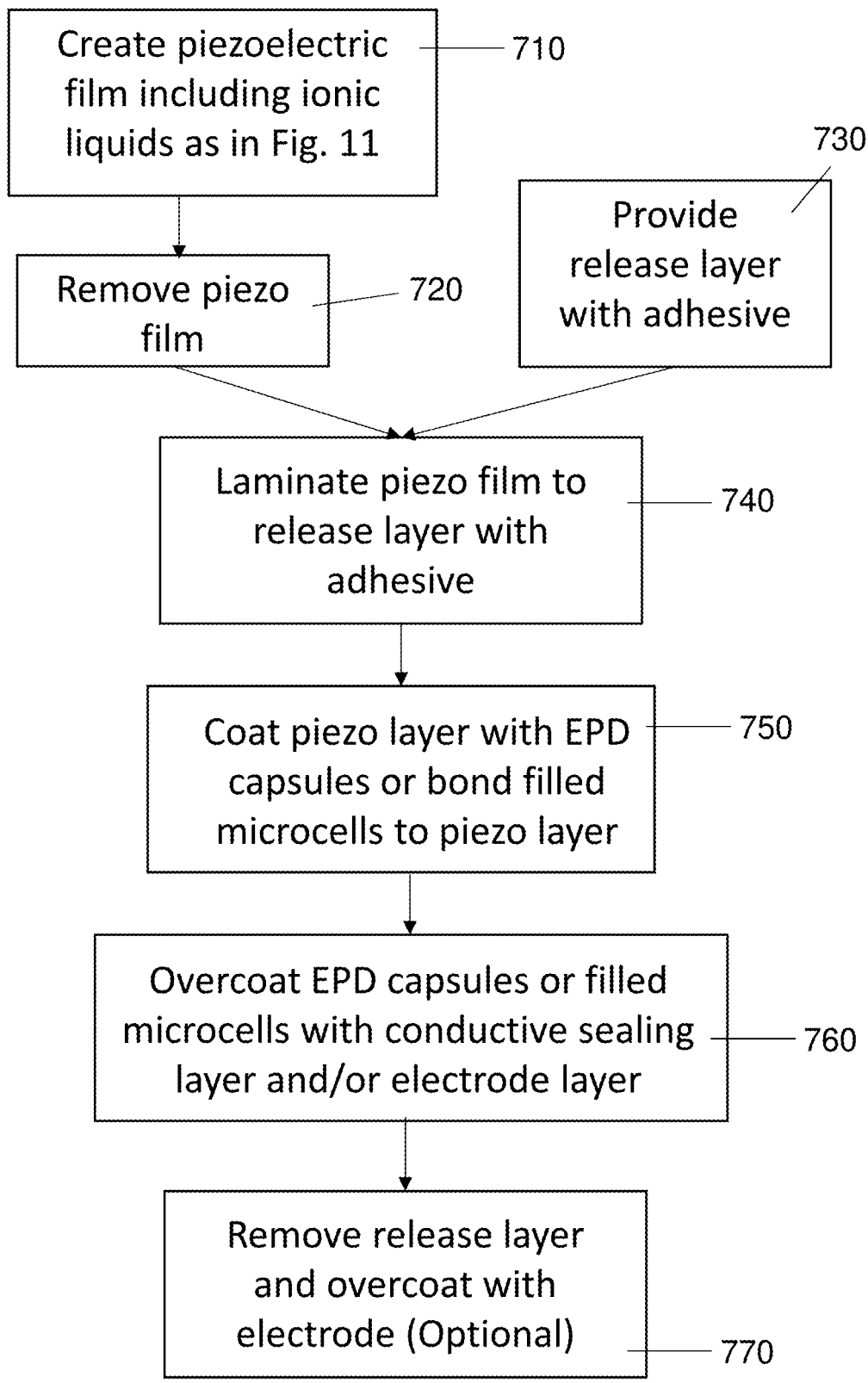
FIG. 7 details a method for creating a piezo-electrophoretic film or (optionally) display.
Figure 8A:
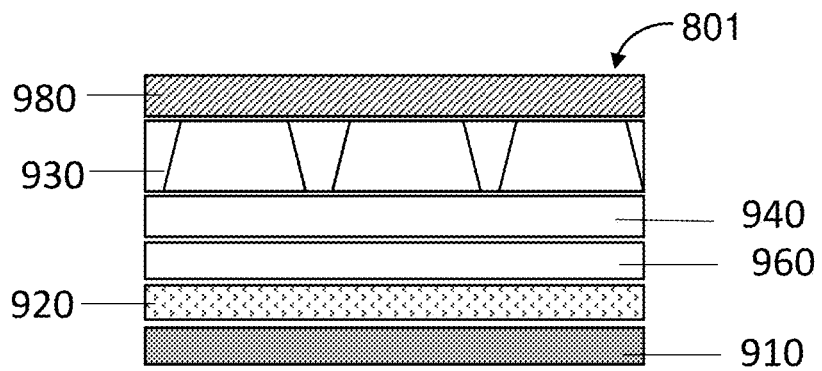
FIG. 8A is a schematic cross section of an embodiment of a piezo-electrophoretic film.
Figure 8B:
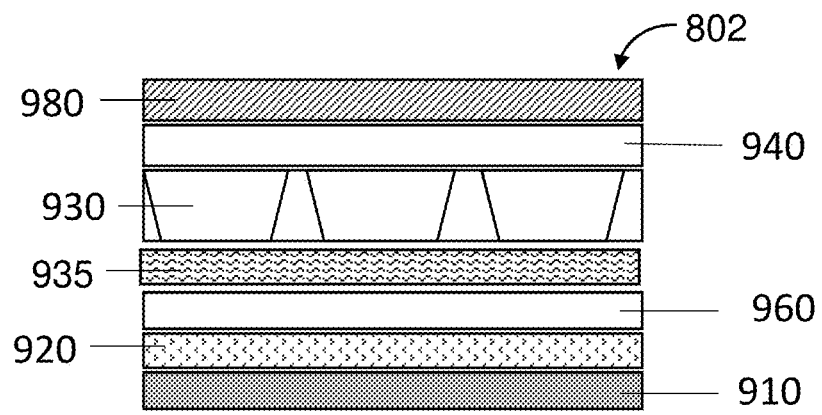
FIG. 8B is a schematic cross section of an embodiment of a piezo-electrophoretic film.
Figure 9A:
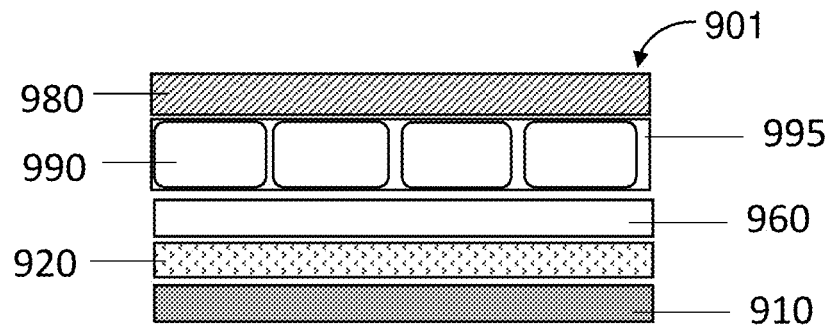
FIG. 9A is a schematic cross section of an embodiment of a piezo-electrophoretic film.
Figure 9B:
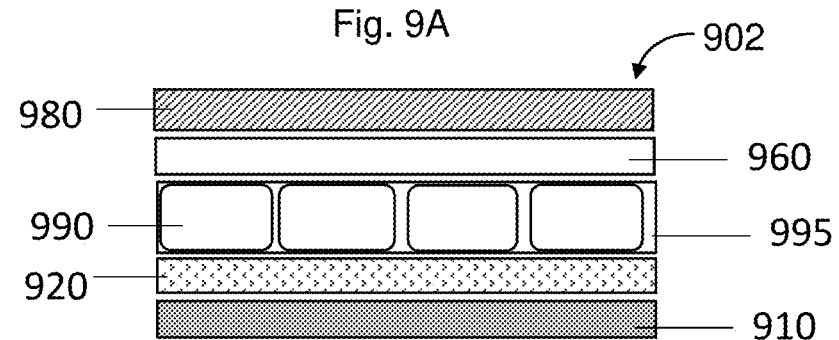
FIG. 9B is a schematic cross section of an embodiment of a piezo-electrophoretic film.

Methods for incorporating piezoelectric polymer films including ionic liquids into low profile piezo-electrophoretic films 801 (see FIG. 8A) are described with respect to FIG. 7. First a thin film of piezoelectric polymer and ionic liquid 960 is created as described above. In step 720, the piezo film 960 is removed from the substrate. The piezo film 960 may be 10 µm thick or less, e.g., 5 µm thick or less, e.g., 3 µm thick or less. Typically, it is not necessary to stretched the piezo film to increase the number of beta phase domains, however that is not excluded from the process. The piezo film 960 is next poled with suitable electric fields as discussed above. In step 730, a release 910 is provided along with an adhesive 920 and the release 910 and adhesive 920 are subsequently laminated to the piezo film 960 in step 740. The piezo film 960 is then coated with/bonded to an electrophoretic layer in step 750. The electrophoretic layer can be a sealed microcell layer, including filled microcells 930 and a sealing layer 940, or alternatively, the electrophoretic layer can include encapsulated electrophoretic media 990 in a polymer binder 995, as shown in FIGS. 9A and 9B. Bonding the piezo film 960 to an electrophoretic layer may be facilitated with an intervening primer layer 935, e.g., using one of the primer materials discussed above. If the electrophoretic layer is a sealed microcell layer, the microcells 930 can be disposed such that the sealing layer 940 is adjacent the piezo film 960 as in FIG. 8A, or the microcells 930 can be disposed such that the sealing layer 940 is disposed on the side opposite the piezo film 960, i.e., as in FIG. 8B. As a final step, 760 an electrode layer 980 is created bonded to/deposited on either the microcells 930 as in FIG. 8A, or bonded to/deposited on the sealing layer 940 as in FIG. 8B. As described above, the electrode layer 980 can include a flexible conductive material such as PEDOT:PSS or it may include a directly-deposited (e.g., sputtered or vapor deposited) transparent conductive oxide (TCO). In some embodiments, the electrode 980 may include a pre-fabricated film of ITO on a polymer substrate, such as PET. A piezo-electrophoretic film 801 including directly-deposited TCO electrode layer 980, a thin piezo layer 960, and a thin layer of microcells 930 (approximately 10 µm thick) is exceedingly thin (i.e., less than 25 µm thick excluding the release 910), which allows the piezo-electrophoretic film 801 to be bent without failure and is not noticeable when affixed to an object such as a bank note. A corresponding piezo-electrophoretic film 901, including microcapsules, can also be fabricated with a total thickness less than 25 µm. Of course, alternative constructions using the thin piezo film 960 are also possible, such as locating the piezo film 960 between the electrode 980 and the electrophoretic layer, i.e., the layer of microcapsules 990, as shown in FIG. 9B. As an alternative, the electrode 980 in FIGS. 8A-9B may be replaced with a conductive adhesive (not shown) or a conductive adhesive in conjunction with an additional release layer (not shown).

Figure 10A:
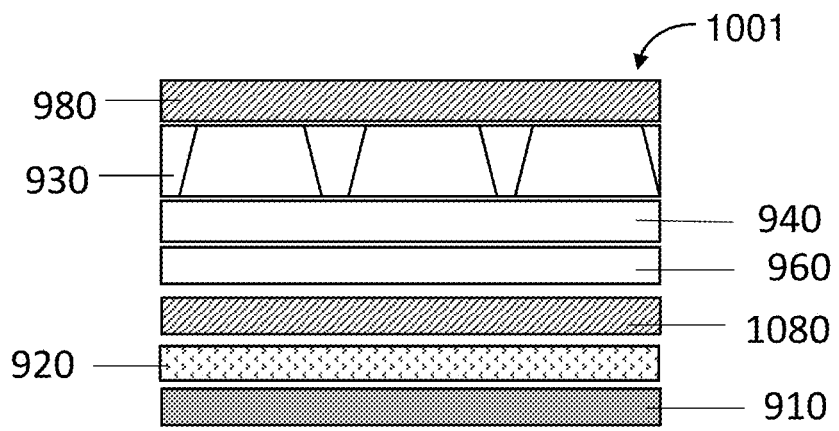
FIG. 10A is a schematic cross section of an embodiment of a piezo-electrophoretic display.
Figure 10B:
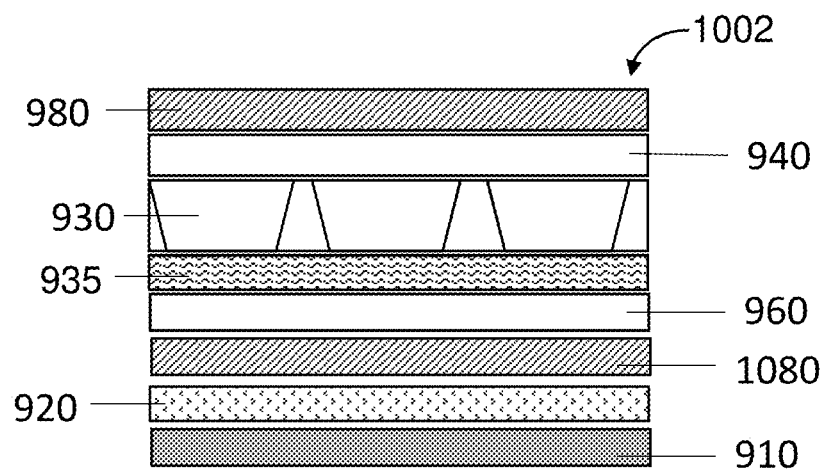
FIG. 10B is a schematic cross section of an embodiment of a piezo-electrophoretic display.
Figure 10C:
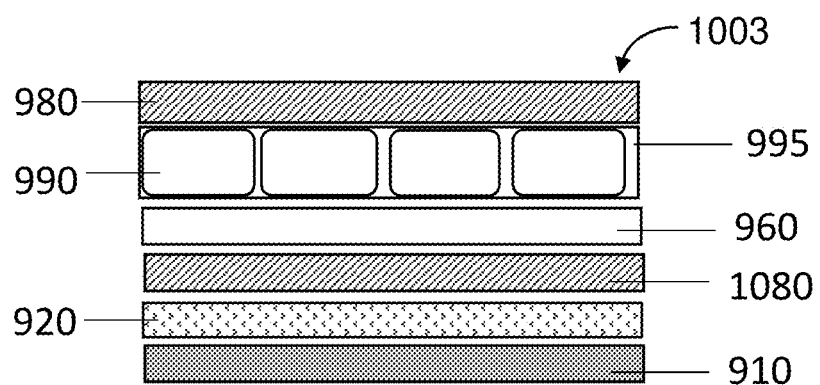
FIG. 10C is a schematic cross section of an embodiment of a piezo-electrophoretic display.

Similar to FIGS. 6A and 6B, the piezo-electrophoretic films of FIGS. 8A-9B can include a second electrode layer to form corresponding displays (1001, 1002, 1003) as shown in FIGS. 10A-10C. The electrode layer 980 and the second electrode layer 1080 are can both comprise a flexible conductive material such as PEDOT:PSS, or the electrode layer 980 and the second electrode layer 1080 may both comprise a directly-deposited (e.g., sputtered or vapor deposited) transparent conductive oxide (TCO), or some combination thereof. Again, in the instance where both the electrode layer 980 and the second electrode layer 1080 use thin TCO films, the resulting piezo-electrophoretic displays (1001, 1002, 1003) can be made very thin, i.e., less than 25 μm thick excluding the release 910. In some embodiments, the electrode layer 980 is created bonded to/deposited on the microcells 930 as in FIG. 10A. In other embodiments, the electrode layer 980 is bonded to/deposited on the sealing layer 940 as in FIG. 10B. The assemblies of piezo-electrophoretic displays 1001 and 1002 can also be used with microcapsules 990 containing electrophoretic media held together with a binder 995, thus creating a piezo-electrophoretic display 1003, as shown in FIG. 10C. As an alternative, the electrodes 980/1080 in FIGS. 10A-10C may be replaced with conductive adhesives (not shown) or conductive adhesive in conjunction with additional release layers (not shown).

It is to be appreciated that an electrode need not be coupled to the piezoelectric film prior to embossing the stack comprising the piezoelectric film and the microcell precursor material. Rather a stack including release, adhesive, piezoelectric film, and microcell precursor can be prepared and the microcell precursor subsequently embossed, filled, and sealed as described above. Alternatively, a stack including release, adhesive, electrode, piezoelectric film, and microcell precursor can also be prepared and the microcell precursor subsequently embossed, filled, and sealed as described above.

It is to be appreciated that piezo-electrophoretic films and piezo-electrophoretic displays described herein can be combined with other known techniques for creating security markers or authenticity labels. For example, a piezo-electrophoretic film or piezo electrophoretic display may additionally include a semi-transparent overlay that does not change optical properties when the piezoelectric film is manipulated. For example, a smiley-face overlay may include eyes constructed from piezo-electrophoretic displays such that when the layered material is bent, the eyes appear to blink. In some embodiments, images or shapes may be printed or laminated onto a solid-colored (e.g., white) background, and must be viewed through the piezo-electrophoretic films to see a pre-arranged pattern. Thus, when not in use, a viewer only sees the solid color, i.e., the printed image or shape will be hidden. However, the printed image or shape will be displayed when the device is manipulated. It is also feasible to adhere a piezo-electrophoretic film or piezo-electrophoretic display to a separate light-transmissive polymer film included in the target product (e.g., bank note) such that the pattern in the piezoelectric layer is only viewable when the target product is held up to a light source and manipulated.

EXAMPLE

A slurry of PVDF and 10% 1-ethyl-3-methylimidazolium tetrafluoroborate (EMIM) ($BF_4$) in DMF was created with mixing and the slight application of heat beyond room temperature. The slurry was cast on a PET web using a slot die coater about 5 μm above the web with a run speed of approximately 10 ft/min. The web went directly into an oven at 160° C. where it spent approximately five minutes before emerging as a thin piezoelectric film. The resulting film was removed from the PET backing and mounted in a thin-film mount for an FTIR spectrometer. The IR absorption spectrum of the resulting PVDF-EMIM-$BF_4$ film (star line) is shown in FIG. 12, compared with a commercial PVDF-TrVDF copolymer film (triangle line) from TE Connectivity (Norwood, Mass.), PVDF (no ionic liquid) that was solution-melted with DMF and cast (open circle line), and PVDF (no ionic liquid) that was solution-melted with DMF and cast and then pulled once the film had cooled (open square line). [The cast and pulled PVDF spectrum (open square line) is offset to make it easier to distinguish from the other spectra, however the baseline is actually quite similar to the PVDF-TrVDF copolymer film and the PVDF-EMIM-$BF_4$ film.]

Figure 12:
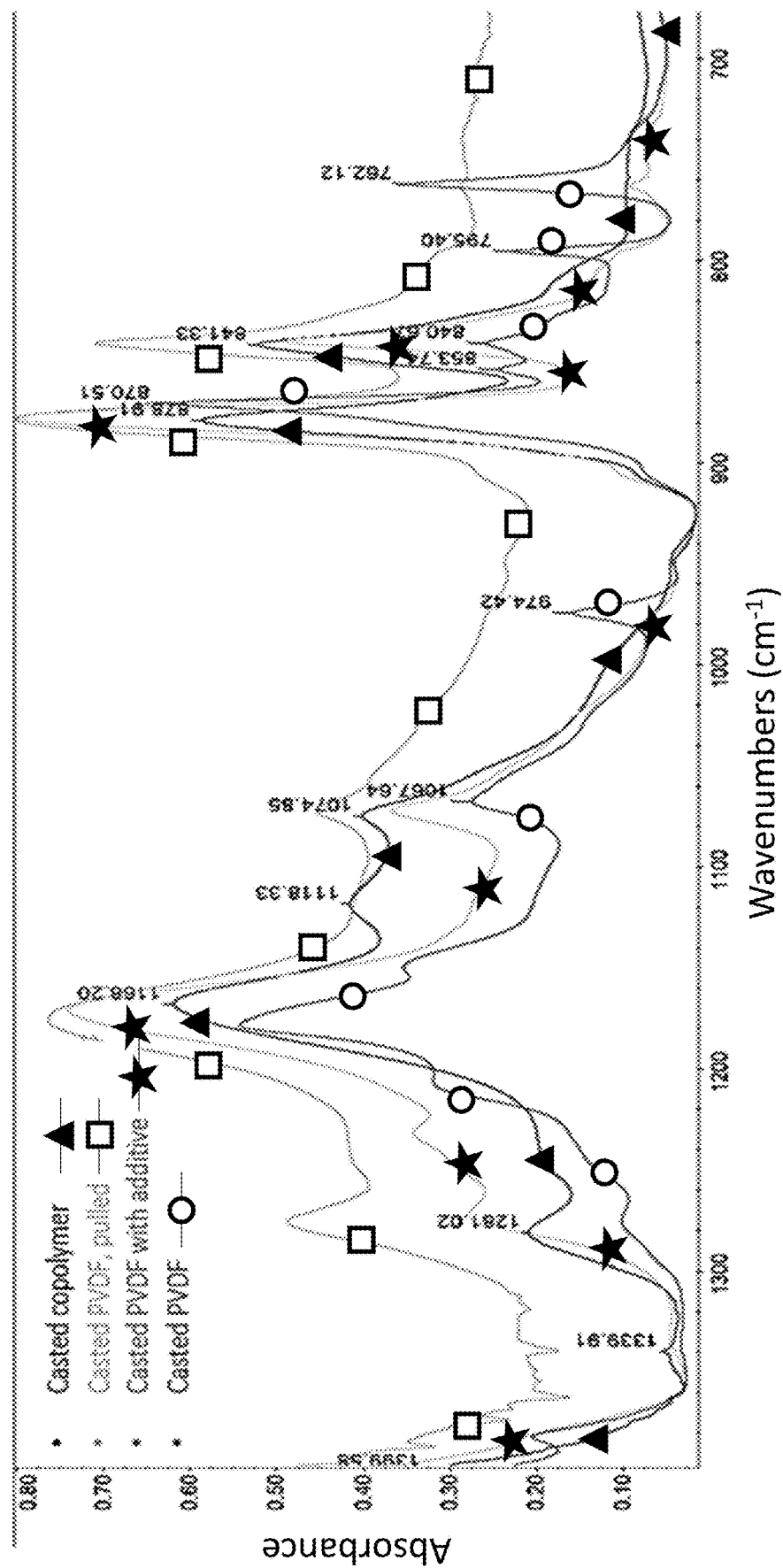
FIG. 12 is an infrared spectrum of a piezoelectric film including ionic liquids as well as comparisons with the native polymer and other methods of increasing the beta phase in the polymer.

As can be seen in the spectra in FIG. 12, the PVDF-EMIM-$BF_4$ film of the invention has the hallmarks of a high beta phase concentration. In particular, the absorption at 974 $cm^{-1}$, corresponding the PVDF alpha phase, is mostly absent for the PVDF-EMIM-$BF_4$ film, while the beta peaks at 1280 $cm^{-1}$ and 840 $cm^{-1}$ are as prominent in the PVDF-EMIM-$BF_4$ film as in the copolymer and pulled samples, which are known to have a high proportion of beta domains. A rough estimate of percentage beta phase, based upon the area under the indicative peaks with a normalized baseline is: cast PVDF=50% beta phase, PVDF-TrVDF copolymer film=85% beta phase, cast and pulled PVDF film=80% beta, and PVDF-EMIM-$BF_4$ film=almost 90% beta phase. It is notable that the casted and pulled PVDF film was not fully transparent in the optical spectrum and showed some waviness when a light source was viewed through the film The other three films were transparent to visible light and had good optical properties.

It will be apparent to those skilled in the art that numerous changes and modifications can be made to the specific embodiments of the invention described above without departing from the scope of the invention. Accordingly, the whole of the foregoing description is to be interpreted in an illustrative and not in a limitative sense.

The invention claimed is:

1. An electrophoretic display film, less than 100 um thick (top to bottom), comprising, in order:
    a first adhesive layer;
    an electrophoretic medium layer;
    a patterned piezoelectric film of comprising polyvinylidene fluoride (PVDF) and less than 10% (wt/wt) of an ionic liquid and having zones of differential polarization; and
    a flexible, light-transmissive electrode layer.

2. The electrophoretic display film of claim 1, wherein the electrophoretic medium layer comprises a plurality of microcapsules containing a non-polar fluid and charged pigment particles that move toward or away from the patterned piezoelectric film when the patterned piezoelectric film is flexed, wherein the microcapsules are coupled to each other with a polymer binder.

3. The electrophoretic display film of claim 1, wherein the electrophoretic medium layer comprises a plurality of microcells containing a non-polar fluid and charged pigment particles that move toward or away from the patterned piezoelectric film when the patterned piezoelectric film is flexed, wherein the non-polar fluid and charged pigment particles are sealed in the microcells with a sealing layer.

4. The electrophoretic display film of claim 1, wherein the electrophoretic display film is less than 50 μm thick.

5. The electrophoretic display film of claim 1, wherein the flexible, light-transmissive electrode layer comprises a metal oxide comprising tin or zinc.

6. The electrophoretic display film of claim 1, wherein the flexible, light-transmissive electrode layer comprises poly (3,4-ethylenedioxythiophene) (PEDOT).

7. The electrophoretic display film of claim 1, further comprising a release sheet coupled to the first adhesive layer.

8. The electrophoretic display film of claim 7, further comprising a second adhesive layer coupled to the flexible, light-transmissive electrode layer, and a second release sheet coupled to the second adhesive layer.

9. The electrophoretic display film of claim 1, wherein the piezoelectric film is less than 10 μm thick.

10. The electrophoretic display film of claim 1, wherein the ionic liquid comprises alkyl-substituted imidazolium cations, alkyl-substituted pyridinium cations, N-heterocyclic cations derived from pyridine, fluorinated counter anions, sulfated counter anions, dicyanamides (N(CN)$_2$), quaternary ammonium cations, or combinations thereof.

11. The electrophoretic display film of claim 10, wherein the ionic liquid is 1-Ethyl-3-methylimidazolium tetrafluoroborate (EMIM) (BF$_4$).

12. An electrophoretic display film, less than 100 um thick (top to bottom), comprising, in order:
a first adhesive layer;
a patterned piezoelectric film comprising polyvinylidene fluoride (PVDF) and less than 10% (wt/wt) of an ionic liquid and having zones of differential polarization;
an electrophoretic medium layer; and
a flexible, light-transmissive electrode layer.

13. The electrophoretic display film of claim 12, wherein the piezoelectric film is less than 10 μm thick.

14. The electrophoretic display film of claim 12, wherein the ionic liquid comprises alkyl-substituted imidazolium cations, alkyl-substituted pyridinium cations, N-heterocyclic cations derived from pyridine, fluorinated counter anions, sulfated counter anions, dicyanamides (N(CN)$_2$), quaternary ammonium cations, or combinations thereof.

15. The electrophoretic display film of claim 14, wherein the ionic liquid is 1-Ethyl-3-methylimidazolium tetrafluoroborate (EMIM) (BF$_4$).

16. The electrophoretic display film of claim 12, wherein the electrophoretic display film is less than 50 μm thick.

17. The electrophoretic display film of claim 12, wherein the flexible, light-transmissive electrode layer comprises a metal oxide comprising tin or zinc.

18. The electrophoretic display film of claim 12, wherein the flexible, light-transmissive electrode layer comprises poly (3,4-ethylenedioxythiophene) (PEDOT).

19. The electrophoretic display film of claim 12, further comprising a release sheet coupled to the first adhesive layer.

20. The electrophoretic display film of claim 19, further comprising a second adhesive layer coupled to the flexible, light-transmissive electrode layer, and a second release sheet coupled to the second adhesive layer.

21. An electrophoretic display film, less than 100 μm thick (top to bottom), comprising, in order:
an adhesive layer;
an electrophoretic medium layer;
a patterned piezoelectric film comprising polyvinylidene fluoride (PVDF) and less than 10% (wt/wt) of an ionic liquid and having zones of differential polarization; and
a conductive adhesive layer.

22. The electrophoretic display film of claim 21, wherein the piezoelectric film is less than 10 μm thick.

23. The electrophoretic display film of claim 21, wherein the ionic liquid comprises alkyl-substituted imidazolium cations, alkyl-substituted pyridinium cations, N-heterocyclic cations derived from pyridine, fluorinated counter anions, sulfated counter anions, dicyanamides (N(CN)$_2$), quaternary ammonium cations, or combinations thereof.

24. The electrophoretic display film of claim 23, wherein the ionic liquid is 1-Ethyl-3-methylimidazolium tetrafluoroborate (EMIM) (BF$_4$).

25. The electrophoretic display film of claim 21, wherein the electrophoretic display film is less than 50 μm thick.

26. The electrophoretic display film of claim 21, further comprising a release sheet coupled to the adhesive layer or the conductive adhesive layer.

\* \* \* \* \*